(12) United States Patent
Salam et al.

(10) Patent No.: US 12,074,661 B2
(45) Date of Patent: Aug. 27, 2024

(54) THREE-DIMENSIONAL VISUALIZATION OF WI-FI SIGNAL PROPAGATION BASED ON BUILDING PLAN WITH IMPLICIT GEOMETRY

(71) Applicant: Cisco Technology, Inc., San Jose, CA (US)

(72) Inventors: Samer Salam, Beirut (LB); Min Se Kim, Cupertino, CA (US)

(73) Assignee: Cisco Technology, Inc., San Jose, CA (US)

(*) Notice: Subject to any disclaimer, the term of this patent is extended or adjusted under 35 U.S.C. 154(b) by 376 days.

(21) Appl. No.: 17/389,572

(22) Filed: Jul. 30, 2021

(65) Prior Publication Data
US 2023/0036982 A1   Feb. 2, 2023

(51) Int. Cl.
*H04B 17/391*   (2015.01)
*G06F 30/18*   (2020.01)
(Continued)

(52) U.S. Cl.
CPC .......... *H04B 17/391* (2015.01); *G06F 30/18* (2020.01); *G06T 15/005* (2013.01); *G06T 15/04* (2013.01);
(Continued)

(58) Field of Classification Search
CPC .. H04B 17/391; H04B 17/318; H04B 17/336; H04B 17/3913; H04B 17/373; H04B 17/00; H04B 17/19; H04B 17/345; H04B 17/26; H04B 17/309; H04B 17/23; G06F 30/18; G06F 3/04847; G06T 15/005; G06T 15/04; G06T 15/08; G06T 17/10;
G06T 2210/04; G06T 2219/2008; G06T 19/20; G06T 11/00; G06T 13/80; G06T 2200/24; H04W 16/20; H04W 24/10; H04W 64/00; H04W 28/18; H04W 16/18; H04W 24/08;
(Continued)

(56) References Cited

U.S. PATENT DOCUMENTS

| 10,117,065 B1 | 10/2018 | De Lorenzo et al. |
| 2006/0019679 A1 | 1/2006 | Rappaport et al. |

(Continued)

OTHER PUBLICATIONS

IEEE (Title: Radio Propagation Measurements and Prediction Using Three-Dimensional Ray Tracing in Urban Environments at 908 MHz and 1.9 GHz; Kim et al. May 1999 (Year: 1999).*

(Continued)

*Primary Examiner* — Mohammed S Chowdhury
(74) *Attorney, Agent, or Firm* — Polsinelli P.C.

(57) ABSTRACT

The present technology is directed to visualizing a Wi-Fi signal propagation in 3-D based on a building plan defined with implicit geometry. The present technology can extract data from a building plan file where a 3-D space and objects in a building plan are defined with implicit geometry, transform the implicit geometry to explicit geometry for the 3-D space and the objects to translate a positioning of the 3-D space and objects from a local coordinate system to a global coordinate system, calculate a RF propagation pattern in the 3-D space based on a RF propagation model for a plurality of Wi-Fi access points located in the 3-D space, and present a 3-D visualization of the RF propagation pattern in the 3-D space.

20 Claims, 14 Drawing Sheets

(51) Int. Cl.
  *G06T 15/00* (2011.01)
  *G06T 15/04* (2011.01)
  *G06T 15/08* (2011.01)
  *G06T 17/10* (2006.01)
  *H04B 17/318* (2015.01)
  *H04B 17/336* (2015.01)
  *H04W 16/20* (2009.01)

(52) U.S. Cl.
  CPC .............. *G06T 15/08* (2013.01); *G06T 17/10* (2013.01); *H04B 17/318* (2015.01); *H04B 17/336* (2015.01); *H04W 16/20* (2013.01)

(58) Field of Classification Search
  CPC ........ G06Q 10/04; G06Q 10/06; H04L 67/12; H04L 67/52; H04L 67/535; H04L 67/566; H04L 12/28; G01S 5/02521
  See application file for complete search history.

(56) References Cited

U.S. PATENT DOCUMENTS

| | | | | |
|---|---|---|---|---|
| 2018/0102858 A1* | 4/2018 | Tiwari | ................... | G06Q 10/04 |
| 2018/0139623 A1* | 5/2018 | Park | .................... | G06V 20/188 |
| 2019/0347867 A1* | 11/2019 | Velappan | ................ | G06T 19/20 |
| 2021/0073449 A1* | 3/2021 | Segev | ..................... | G06F 30/27 |
| 2021/0111815 A1 | 4/2021 | Dion et al. | | |
| 2022/0165040 A1* | 5/2022 | Munkberg | ............. | G06T 19/20 |
| 2022/0383549 A1* | 12/2022 | Zheng | ................ | G01B 11/2513 |

OTHER PUBLICATIONS

IEEE Visualizing Wi-Fi Access Point Measurements and Location Data Using Graph Layouts. Robert E. Guinness & José M. Vallet García. IEEE 2017. (Year: 2017).*

IEEE: The accuracy of propagation models for distance measurement between WSN nodes. M. Malajner, K. Benkič, P. Planinšič, Ž. Čučej; 2009. (Year: 2009).*

IEEE: Wifi Signal Propagation at 2.4 GHz; Muzaiyanah Hidayab, Abdul Halim Ali, Khairul Bariah Abas Azmi. 2009; (Year: 2009).*

Lee, "3D Coverage Location Modeling of Wi-Fi Access Point Placement In Indoor Environment," Elsevier, 2015, pp. 1-10.

* cited by examiner

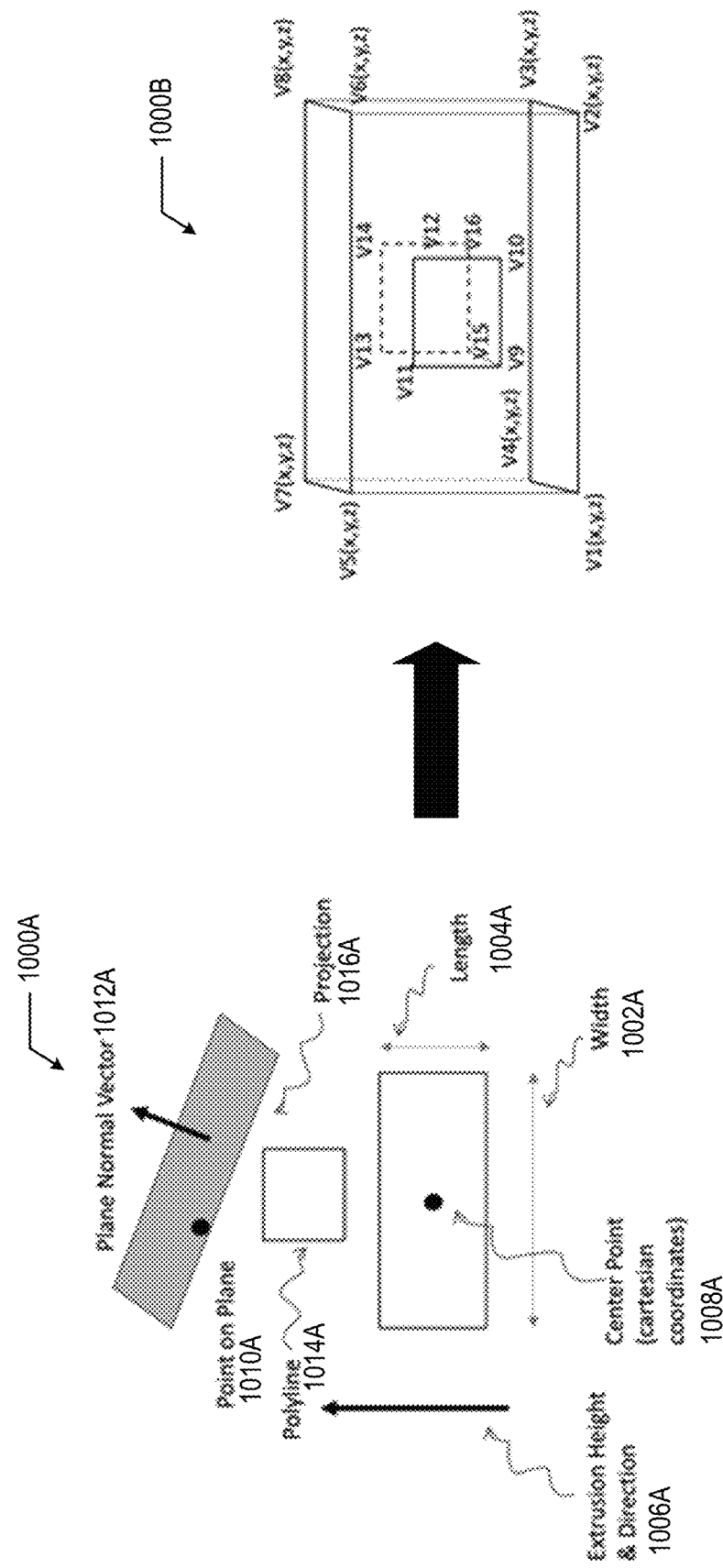

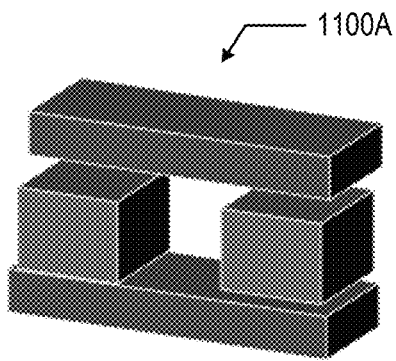
Naïve Polygonization (4 cuboids with negative attentuation)
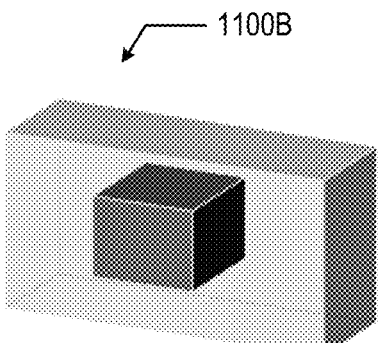
Optimized Polygonization (2 cuboids - smaller cuboid has positive attenuation to factor for opening in wall)
FIG. 11A
(prior art)
FIG. 11B
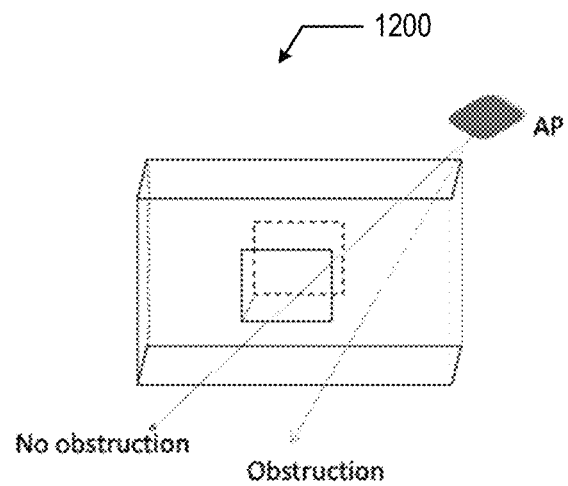
FIG. 12

THREE-DIMENSIONAL VISUALIZATION OF WI-FI SIGNAL PROPAGATION BASED ON BUILDING PLAN WITH IMPLICIT GEOMETRY

TECHNICAL FIELD

The subject matter of this disclosure relates in general to the field of wireless networks, and more particularly, to systems and methods for providing a three-dimensional (3-D) visualization of a wireless signal propagation based on a building plan defined with implicit geometry.

BACKGROUND

With growing interest in optimizing the wireless network infrastructure to improve the wireless network performance, various wireless network planning tools are available for analyzing, visualizing, and troubleshooting the wireless signal propagation of the wireless network. A visualization of the wireless signal propagation can help understanding the signal propagation (e.g., Wi-Fi coverage) (i.e., assessing the signal propagation behavior) and validating the signal propagation based on signal level measurements from APs and sensors so that an optimized wireless network can be designed as to where to place or how to configure Wi-Fi access points.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not, therefore, to be considered to be limiting of its scope, the principles herein are described and explained with additional specificity and detail through the use of the accompanying drawings in which:

FIGS. 10A and 10B illustrate an example geometry extraction including a bounded clipping in accordance with some examples of the present disclosure.

FIG. 11A illustrates an example of traditional polygonization and FIG. 11B illustrates an optimized polygonization in accordance with some examples of the present disclosure.

FIG. 12 illustrates an example of ray tracing in accordance with some examples of the present disclosure.

DETAILED DESCRIPTION

Figure 1:
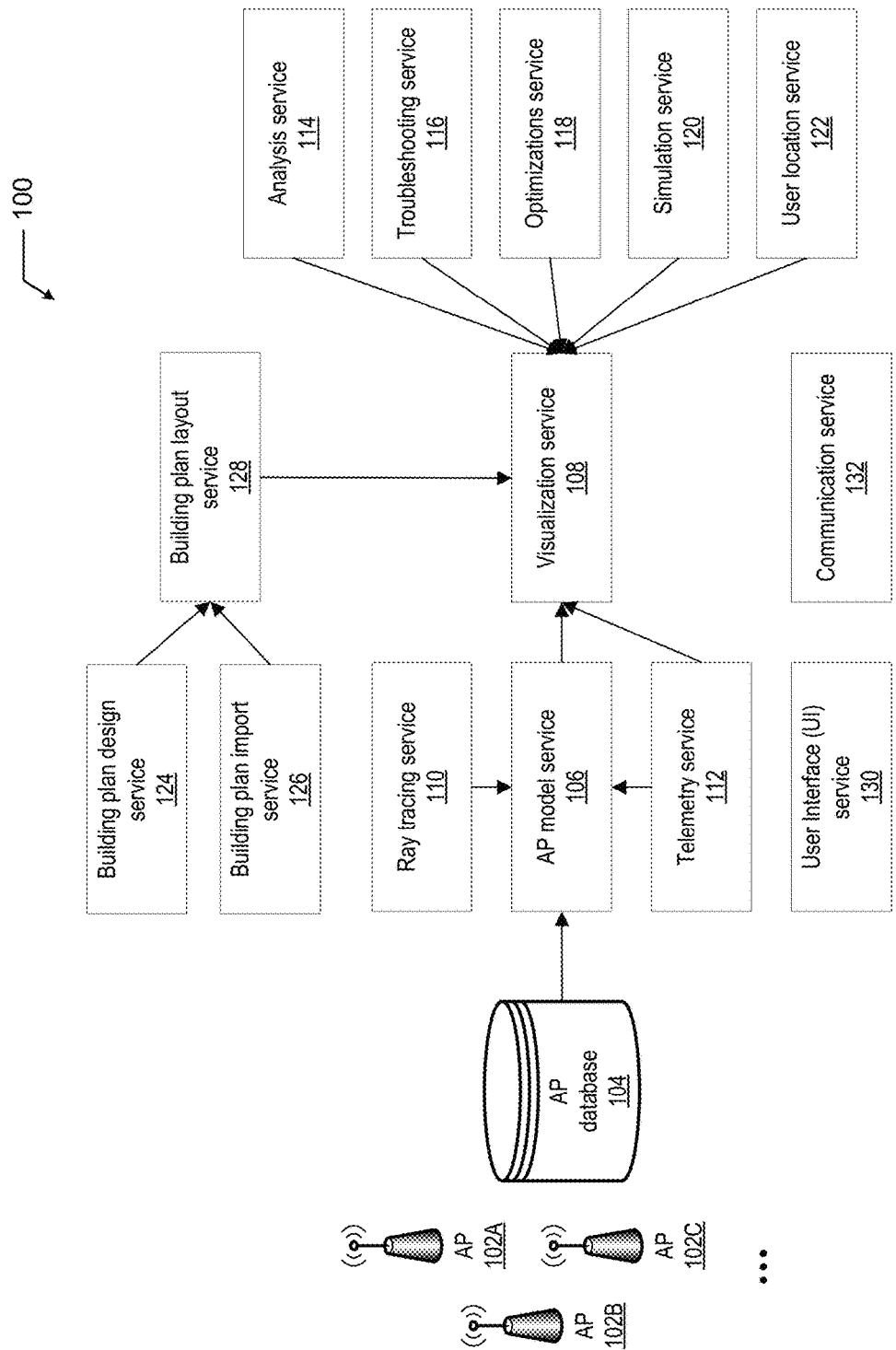
FIG. 1 illustrates an example visualization system for presenting a wireless signal propagation in 3-D according to some aspects of the disclosed technology.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

In order to aid with designing and planning a wireless network, various wireless network planning tools are available for analyzing, simulating, visualizing, and troubleshooting the wireless signal propagation of the wireless network. Most wireless network planning tools that leverage visualizations display the signal propagation based on wireless Key Performance Indicators (KPIs) in a two-dimensional (2-D) heat map.

Some wireless network planning tools utilize a CAD file to render a 3-D visualization as a basis for a building plan to construct the building geometry. However, the CAD file lacks semantic information that captures the nature of objects and structures of the building. A user needs to go through a laborious process of establishing details pertaining to the definition of the geometry including a type of obstructions, a type of materials, etc. As the wireless signal propagation (e.g., Wi-Fi coverage) can be affected by many different factors, such semantic information regarding the objects and structure of the building is critical in computing the KPIs and further providing an accurate visualization of the wireless signal propagation of the dynamic wireless network.

For the foregoing reasons, a building plan file that is rich with a diverse set of semantics pertaining to the structures and objects of the building plan, for example, a Building Information Modeling (BIM) file becomes a more attractive option for a wireless network planning tool to visualize the wireless signal propagation. Based on the detailed information regarding the structure and objects of the building plan, a more accurate attenuation level can be computed. However, extracting such data can be complicated since objects in the building plan, for example, in a BIM file, are defined with implicit geometry, which needs to be first translated into an explicit geometry to enable calculating the wireless signal propagation based on KPI computations.

Therefore, there exists a need for 3-D visualization of a Wi-Fi signal propagation based on a building plan where objects are defined with implicit geometry. There is also a strong need to calculate a wireless signal propagation from a Wi-Fi access point in a building plan defined with implicit geometry.

The present technology includes systems, methods, and computer-readable media for solving these problems and discrepancies. Specifically, systems, methods, and computer-readable media for providing a 3-D visualization of a Wi-Fi signal propagation based on a building plan defined with implicit geometry are provided in the present disclosure.

Overview

The present technology includes systems, methods, and computer-readable media are provided for visualizing a Wi-Fi signal propagation in 3-D based on a building plan defined with implicit geometry.

According to at least one example of the present technology, a method includes extracting data from a building plan file, wherein a 3-D space and objects in a building plan are defined with implicit geometry. The method further includes transforming the implicit geometry to explicit geometry for the 3-D space and the objects to translate a positioning of the 3-D space and objects from a local coordinate system to a global coordinate system. Also, the method includes calculating a RF propagation pattern in the 3-D space based on a RF propagation model for a plurality of Wi-Fi access points located in the 3-D space. Furthermore, the method includes presenting a 3-D visualization of the RF propagation pattern in the 3-D space.

In another example, a system for visualizing a RF propagation pattern based on a building plan defined with implicit geometry (e.g., 3-D signal propagation visualization system) is provided that includes a storage (e.g., a memory configured to store data, such as virtual content data, one or more images, etc.) and one or more processors (e.g., implemented in circuitry) coupled to the memory and configured to execute instructions and, in conjunction with various components (e.g., a network interface, a display, an output device, etc.), cause the one or more processors (e.g., a visualization service) to extract data from a building plan file, wherein a 3-D space and objects in a building plan are defined with implicit geometry, transform the implicit geometry to explicit geometry for the 3-D space and the objects to translate a positioning of the 3-D space and objects from a local coordinate system to a global coordinate system, calculate a RF propagation pattern in the 3-D space based on a RF propagation model for a plurality of Wi-Fi access points located in the 3-D space, and present a 3-D visualization of the RF propagation pattern in the 3-D space.

A non-transitory computer-readable storage medium having stored therein instructions which, when executed by one or more processors (e.g., a visualization service), can cause the one or more processors to extract data from a building plan file, wherein a 3-D space and objects in a building plan are defined with implicit geometry, transform the implicit geometry to explicit geometry for the 3-D space and the objects to translate a positioning of the 3-D space and objects from a local coordinate system to a global coordinate system, calculate a RF propagation pattern in the 3-D space based on a RF propagation model for a plurality of Wi-Fi access points located in the 3-D space, and present a 3-D visualization of the RF propagation pattern in the 3-D space.

DESCRIPTION

FIG. 1 illustrates an example 3-D signal propagation visualization system 100 for presenting a wireless signal propagation in 3-D according to some aspects of the disclosed technology. As shown in FIG. 1, the 3-D signal propagation visualization system 100 can include one or more services primarily responsible for examining and analyzing signals from a plurality of access points (APs) 102A, 102B, 102C, . . . (collectively, 102), determining a signal propagation pattern for the APs 102 based on a signal propagation model, and providing a 3-D visualization of the signal propagation pattern including analysis, troubleshooting, simulations, or optimizations of the signal propagation pattern.

The 3-D signal propagation visualization system 100 can include an AP database 104 that includes information about the plurality of APs 102, which are configured to transmit wireless communication signals. In some aspects, the information about the plurality of APs 102 can include, but is not limited to a location of APs 102 and their orientation (e.g., azimuth and elevation angles), a model number, a signal strength, end-of-life data, an antenna type, a channel, a frequency (band), or network information of which the APs 102 belong.

The 3-D signal propagation visualization system 100 can include an AP model service 106 that is a collection of signal propagation models for different types of AP antennae 102. In some examples, the signal propagation model includes a description of the signal propagation pattern based on the information associated with the AP antennae 102. For example, such information can be provided by the AP database 104 or related to parameters derived from various configuration attributes and measurements such as transmission power (txPower), signal-to-noise ratio (SNR), Key Performance Indicator (KPI) values, or Received Signal Strength Indication (RSSI) values.

The 3-D signal propagation visualization system 100 can include a visualization service 108 configured to perform 3-D modeling, i.e., display a 3-D visualization of the signal propagation pattern based on the signal propagation model. In some examples, the visualization service 108 can display the 3-D visualization of the signal propagation in the form of a heatmap, which uses color-coding to represent different values of the signal strength. In some instances, the visualization service 108 can generate a time-based (temporal) visualization where changes in the signal propagation pattern over time can be presented in the 3-D visualization.

The 3-D signal propagation visualization system 100 can also include a ray tracing service 110 configured to perform ray tracing from a particular AP. In some examples, the raytracing service 110 can compute attenuation based on the line-of-sight from a particular AP to a certain vertex in space. For example, ray tracing can be used to visualize the signal propagation by tracing paths of electromagnetic waves and simulating the way that the waves interact with any objects it may hit. If a straight line is drawn from a particular AP and does not hit anything in the space, then the signal propagation model works in a straightforward manner. On the other hand, if there is an obstacle (e.g., a wall, shelving, ceiling, etc.) along the path, the signal propagation pattern can be broken into multiple segments since the signal propagation pattern can change depending on the properties of the obstacle that the pattern has to pass through.

The 3-D signal propagation visualization system 100 can include a telemetry service 112 configured to collect and record data from the plurality of APs 102 or sensors on the floor pertaining to the APs 102 in space. In some examples, the telemetry data can be used to update information about a particular AP (e.g., model, antenna type, etc.) or feed into the visualization service 108 to provide an optimized 3-D visualization instead of relying on a predicted model. In some instances, the telemetry service 112 can utilize the telemetry data to validate a certain predicted model.

The 3-D signal propagation visualization system 100 can also include an analysis service 114 that is configured to analyze data associated with the wireless coverage such as SNR measurements, latency measurements, a number of client devices at each of the APs, KPI values, txPower measurements, or RSSI measurements. In some instances, the analysis service 114 can further perform analysis pertaining to data associated with one or more errors or constraints of the APs 102 that can impact the wireless coverage.

The 3-D signal propagation visualization system 100 can include a troubleshooting service 116 configured to perform various types of troubleshooting by isolating and root-causing issues or errors relating to the network performance and signal propagation pattern based on the APs 102 and providing suggestions to resolve such issues or errors. In some examples, the troubleshooting service 116 can identify both cause and consequences of the issues, for example, obstructions in the line of sight, a level of signal coverage, a number of client devices connected to APs, co-channel interference, or stickiness to APs.

The 3-D signal propagation visualization system 100 can include an optimization service 118 configured to provide a 3-D visualization of the optimized signal propagation pattern that provides better operational signal coverage and lower interference. In some examples, the optimization service 118 can provide an upgrade option for the APs or configuration settings to achieve improved network performance. In some instances, the optimization service 118 can provide the optimized 3-D visualization that illustrates dynamic changes as conditions in the network change. In some examples, the optimization service 118 can propose different optimized layouts by radio spectrum (RF) or deployment of the APs for a given space.

The 3-D signal propagation visualization system 100 can also include a simulation service 120 configured to simulate various scenarios relating to deployment of APs, potential network failures, estimated RF leakage, or alternative network configurations. In some instances, the simulation service 120 can provide a simulated 3-D visualization of the various proposed layouts provided by the optimization service 118.

In some examples, the simulation service 120 can provide a simulated 3-D visualization illustrating the impact of an alternative deployment of APs, for example, how the signal propagation pattern is impacted by deploying a new or upgraded AP at different locations on the floor. Also, the simulation service 120 can simulate a 3-D visualization based on the impact of an upgrade or different AP upgrade strategies prior to the actual update to observe and compare the wireless coverage.

Furthermore, a type of materials of obstructions in the space can significantly impact the signal propagation pattern. The simulation service 120 can provide a simulated visualization of the signal propagation pattern depending on the type of materials of obstacles such as walls or shelving, or what is stored on shelving (e.g., liquid, metal, non-metal, etc.).

Additionally, the simulation service 120 can provide a simulated 3-D visualization illustrating potential network failures. For example, the simulation service 120 can help define coverage zones to avoid coverage blackout zones in common.

The 3-D signal propagation visualization system 100 can also include a user location service 122 configured to identify a location of a user (e.g., client device) and obtain data associated with the user/client device to determine the signal propagation pattern. For example, a client density can significantly affect the wireless network coverage.

In some examples, the user location identified by the user location service 122 can be combined with an AP coverage so that the 3-D visualization can include the impact of the client device such as an operating system of client devices, client device density, or any RF interference due to the presence of RF-emitting device (e.g., mobile phones, cordless phones, wireless security cameras, etc.).

In some examples, the user location service 122 can help to optimize the latency and the signal propagation pattern by identifying the location of client devices and the type of services that the client devices are performing. For example, too many client devices performing VoIP calls on the same AP can worsen the network performance and cause a bad call quality due to latencies. The 3-D visualization of the signal propagation pattern can include the user location provided by the user location service 122 to illustrate such impact of the client devices on the wireless network coverage.

The 3-D signal propagation visualization system 100 can also include a building plan design service 124 configured to allow a user to manage the settings of the building plan or the floor plan of the space (e.g., layout, objects, viewpoint, etc.).

The 3-D signal propagation visualization system 100 can include a building plan import service 126 configured to import a building plan or a floor plan. The building plan or the floor plan can be in any suitable format, for example, a Building Information Modeling (BIM) file or a Computer-Aided Design (CAD) file. In some examples, the building plan import service 126 can import the building plan or the floor plan that contains a technical drawing, blueprint, schematic, or 3-D rendering of the floor that is to be visualized in 3-D.

In some instances, the signal propagation pattern can be overlaid over the building plan or the floor plan provided by the building plan import service 126. Depending on the type of the imported file for the building plan, details of the building or the floor such as a type of materials of the obstacles (e.g., a wall, etc.) or location of APs or sensors can further be included in the building plan.

The 3-D signal propagation visualization system 100 can also include a building plan layout service 128 configured to store the building plan layout and support the 3-D visualization of the building plan layout. In some examples, the building plan layout service 128 can perform the function of a management and control platform for managing, monitoring, and storing data associated with the visualization based on the building plan.

The 3-D signal propagation visualization system 100 can also include a user interface service 130 configured to allow a user to manage and control settings of the visualization or network configurations to optimize the 3-D visualization. For example, the settings can include a viewpoint (e.g., a first-person perspective, an orbit view, or a bird's eye view), layout, parameters (e.g., txPower, SNR measurements, KPI values, RSSI values, etc.), or visualization options. Also, the examples of network configurations can include but are not limited to elevation or azimuth angle of APs, deployment of APs, band and a type of network or APs.

In some instances, the user interface service 130 can provide information to or receive feedback from the user via a communication service 132 as further described below. In some examples, the user may be asked to evaluate and manage various suggestions proposed by the troubleshooting service 116 or the optimization service 118.

The 3-D signal propagation visualization system 100 can also include a communication service 132 configured to transmit and receive information wirelessly over a network. In some examples, the communication service 132 can send and receive communications from/to a building plan system (not shown) that may provide building plan updates. In some instances, the communication service 132 can transmit and receive data from/to a user for analyzing, troubleshooting, simulating, or optimizing the 3-D visualization of the signal propagation pattern.

Figure 2:
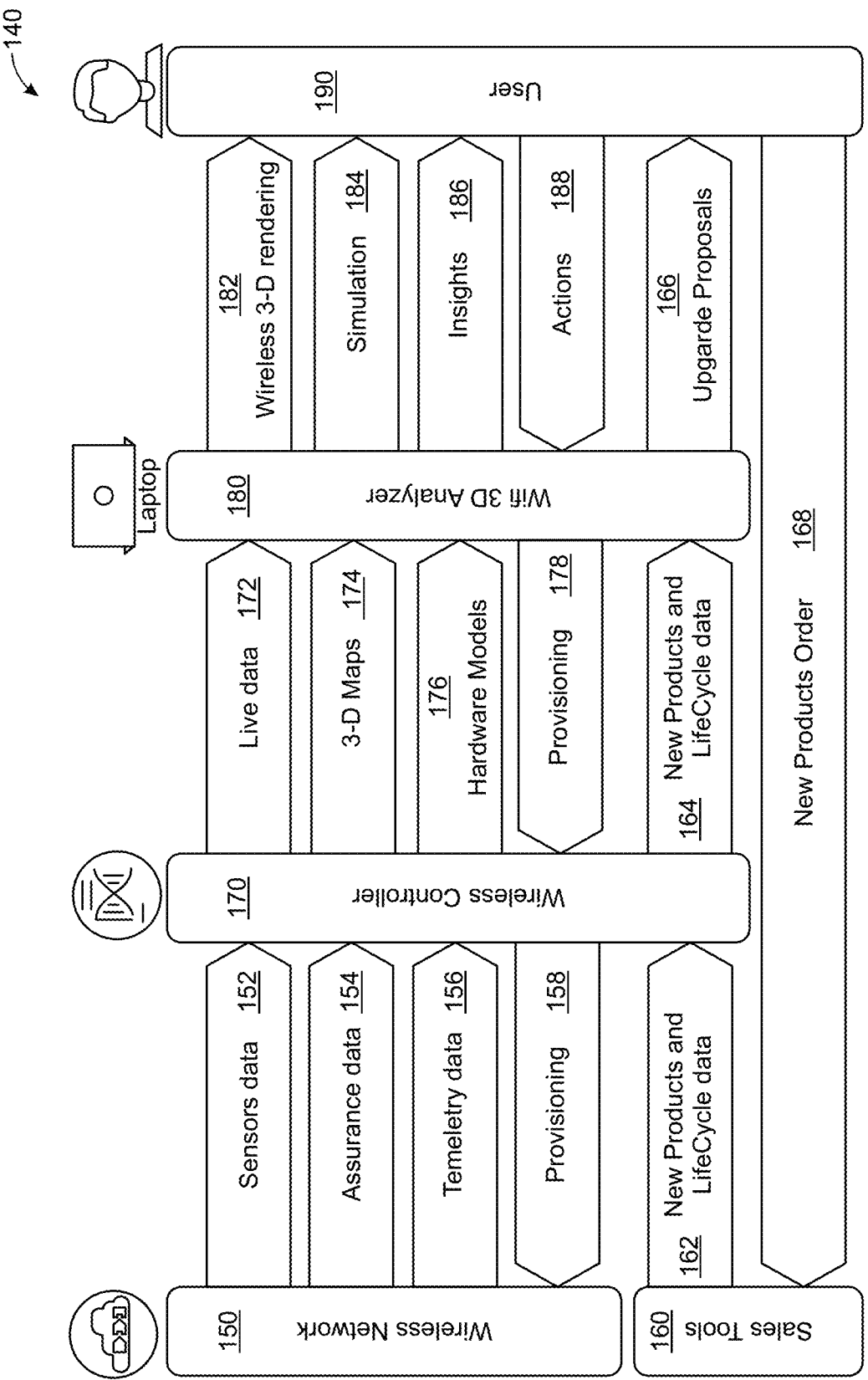
FIG. 2 illustrates an example network architecture of a visualization system for presenting a wireless signal propagation in 3-D according to some aspects of the disclosed technology.

FIG. 2 illustrates an example network architecture 140 for the 3-D signal propagation visualization system 100 illustrated in FIG. 1 according to some aspects of the disclosed technology. The network architecture 140 comprises a wireless network 150, sales tools 160, a network controller 170, a Wi-Fi 3-D analyzer 180, and a user 190. In some embodiments, Wi-Fi 3-D analyzer 180 executes on a client device and takes advantage of hardware acceleration capabilities from a graphics processor, but Wi-Fi 3-D analyzer 180 can operate in other environments such as a server or on a device with only general processing capabilities. Even though the network controller 170 and Wi-Fi 3-D analyzer 180 are illustrated as separate components in FIG. 2, in some examples, they can be a single device (i.e., the Wi-Fi 3-D analyzer 180 is run on the network controller 70 itself).

The wireless network 150 comprises APs 102 illustrated in FIG. 1, sensor(s), and user devices. The network controller 170 can include AP database 104, AP model service 106, telemetry service 112, user location service 122, building plan design service 124, building plan import service 126, and building plan layout service 128, all of which are illustrated in FIG. 1. The Wi-Fi 3-D analyzer 180 can include visualization service 108, analysis service 114, troubleshooting service 116, optimizations service 118, simulation service 120, and user interface service 130, all of which are also illustrated in FIG. 1.

The wireless network 150 can transmit sensor data 152, assurance data 154, and/or telemetry data 156 to the network controller 170. The network controller 170 can store such received data and can provide user interfaces and APIs for receiving network configurations and updates. Network configurations can be used to provision 158 various devices in wireless network 150. Also, the network controller 170 can transmit live data 172, 3-D maps 174 (e.g., 3-D building plans or floor plans), and/or hardware models 176 to the Wi-Fi 3-D analyzer. While not shown in FIG. 2, alternatively, live data 172, 3-D maps 174, and/or hardware models 176 can be exported to cloud instead of a local PC or GPU and provide user 190 with insights 186.

The Wi-Fi 3-D analyzer 180 can use the 3-D maps 174 and hardware models 176 to generate predictions or simulations of wireless signal propagation and their correlation with the live data 172. Based on the data received from the network controller 170, the Wi-Fi 3-D analyzer 180 can provide wireless 3-D rendering 182, simulation 184, and/or insights 188 to the user 190. For example, the user can be provided with the wireless 3-D rendering 182 of the wireless signal coverage (e.g., RF coverage) and options to run simulations 184 for what-if scenarios, and insights 186 including suggestions for improving the network performance associated with the wireless signal coverage. Based on what is provided by the Wi-Fi 3-D analyzer 180, the user 190 can take action 188 accordingly, for example, modifying a network configuration to improve the network performance. Wi-Fi 3-D analyzer 180 can forward any updates to the network configuration for provisioning 178 to the network controller 170.

Furthermore, the sales tools 160 can provide a product upgrade management based on the communication flow between the sales tools 160, the network controller 170, and the Wi-Fi 3-D analyzer 180. The sales tools 160 can transmit new products and lifecycle data 162 to the network controller 170. Then the network controller 170 forwards the new products and lifecycle data 164 to the Wi-Fi 3-D analyzer 180. The new products and lifecycle data 162 and 164 can include new product availability for sale or end-of-life dates for AP products.

Based on the new products and lifecycle data 164, the Wi-Fi 3-D analyzer 180 can provide upgrade proposals 166, which can include simulation 184 and insights 186 on product upgrade, to the user 190. Also, in response to the upgrade proposals, the user 190 can place a new product order 168 by utilizing the sales tools 160. For example, the new products and lifecycle data 162 can include end-of-life data associated with a particular AP so that an upgrade or replacement of a new AP can be recommended based on the end-of-life data prior to the expiry of the AP. Also, the user 190 can place an order for a new AP with the sales tools 160.

Figure 3:
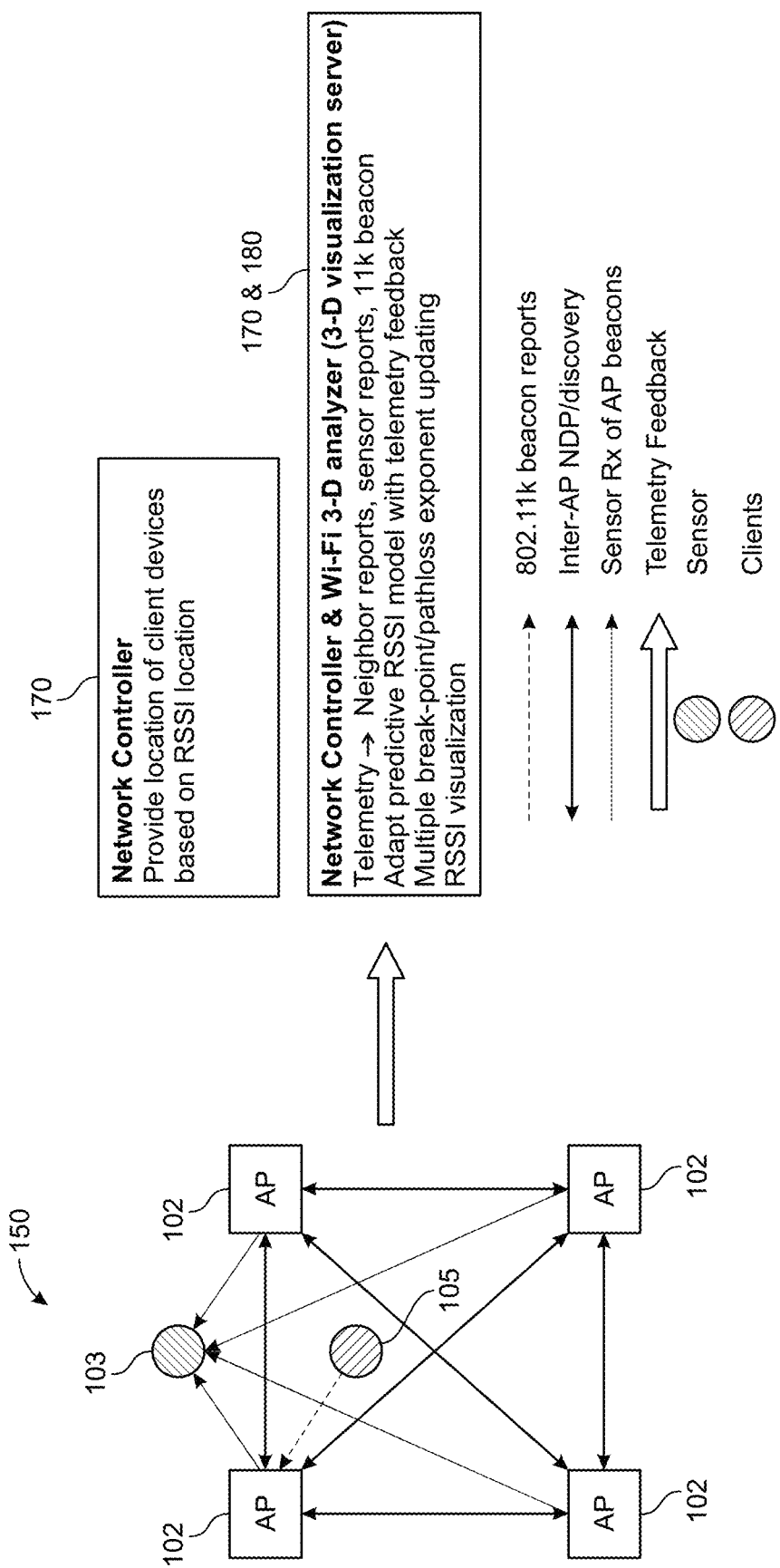
FIG. 3 illustrates an example network architecture diagram of a visualization system for presenting a wireless signal propagation in 3-D according to some aspects of the disclosed technology.

FIG. 3 illustrates an example network architecture diagram for a wireless network 150, a network controller 170, and a Wi-Fi 3-D analyzer 180 according to some aspects of the disclosed technology. The wireless network 150, also illustrated in FIG. 2, comprises APs 102 and sensors 103 and client devices 105.

The wireless network 150 can transmit telemetry feedback (for example, telemetry data 156 illustrated in FIG. 2) to the network controller 170. For example, each AP 102 transmits beacons to the sensor 103 whereby a sensor report can be generated. Also, the APs 102 communicate with each other via inter-AP Neighbor Discovery Protocol (NDP) to generate neighbor reports. Furthermore, client device 105 measures beacons and returns a report with stored beacon information (e.g., 802.11k beacon reports). Based on the neighbor reports, 802.11k beacon reports, and sensor reports, the wireless network 150 provides telemetry feedback to the network controller 170. The telemetry feedback can include information about a distance and azimuth angle between a pair of APs or an AP and a sensor and walls or any obstructions between the pair on a building plan or a floor plan. Also, network controller 170 includes location information of client devices based on RSSI location, which is received from the wireless network 150.

Based on the data provided by the wireless network 150, the network controller 170 and the Wi-Fi 3-D analyzer 180 can determine a predictive RSSI model and visualize the predicted RSSI at all 3-D locations.

Figure 4:
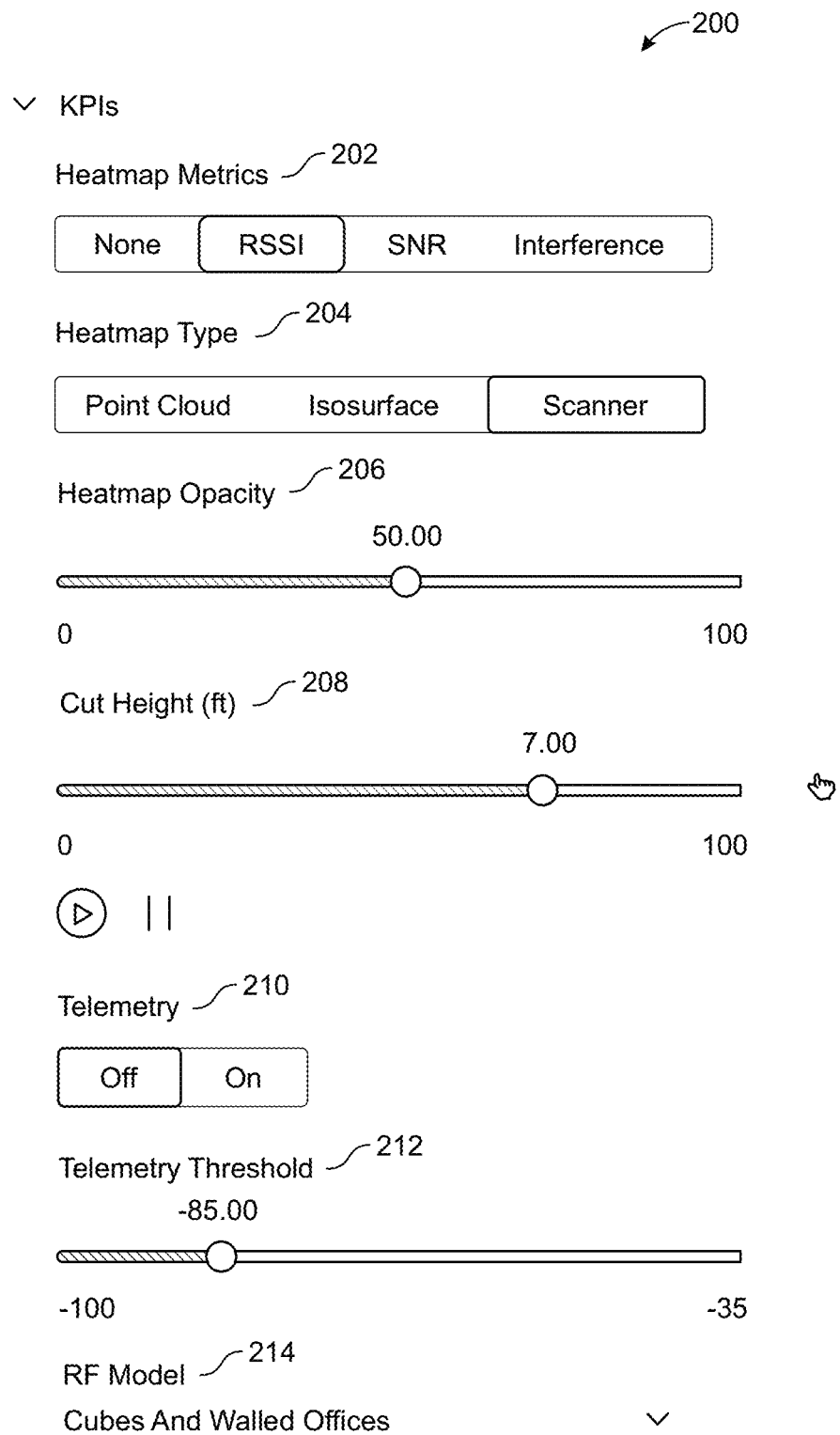
FIG. 4 illustrates an example control menu for a 3-D visualization system according to some aspects of the disclosed technology.

FIG. 4 illustrates an example menu 200 including a list of various parameters that can be adjusted for the 3-D visualization of the wireless signal propagation.

The menu 200 provides an option for key performance indicator (KPI) heatmap metrics 202, for example, none, RSSI, SNR, or Interference. Depending on the selected heatmap metrics, the 3-D visualization of the wireless signal propagation can be presented based on RSSI values, SNR measurements, or interference measurements. RSSI values are a predicted or measured power level at a point in space of an RF transmitted from an AP. SNR measurements are based on the amplitude of signal and noise level. Interference measurements or predictions are based on the power of the interfering signals.

The menu 200 also provides an option for heatmap type 204, for example, point cloud, isosurface, or scanner. A point cloud heatmap provides the 3-D visualization of the wireless signal propagation as a collection of color-coded points where a color variation corresponds to a degree of signal strength. An isosurface heatmap displays the 3-D visualization of the wireless signal propagation with isosurfaces (e.g., contour lines or surfaces) where each isosurface represents points of equal values in a 3-D space. A scanner provides the 3-D visualization of the wireless signal propagation with color-coded bands where the color of the bands correspond to a degree of signal strength. Also, the scanner allows a user to manipulate a height in the 3-D space, for example, via a height manipulation bar under a cut height 208 so that the wireless signal propagation pattern can be scanned through the 3-D space, for example, from a ground to a ceiling and visualized at varying heights.

Furthermore, a heatmap opacity 206 can be adjusted, for example, in a scale of 0 (i.e., non-transparent) to 100 (i.e., fully transparent) to adjust the transparency of the 3-D visualization.

Also, cut height (ft) 208 can be adjusted, for example, in a scale of 0 to 10. A user can select a particular height where the 3-D visualization is desired. Or, with a play button and a pause button, the 3-D visualization of the wireless signal propagation can be simulated at continuously varying heights from 0 ft to 10 ft.

The menu 200 also provides an option where a visualization of telemetry data 210 can be switched on and off. Also, telemetry threshold 212 can be adjusted, for example, in a scale of −100 to −35.

Furthermore, the menu 200 provides an option for a RF Model selection 214. For example, a drop-down list provides various options for the RF model such as cubes and walled offices, drywall offices, or open space.

While not shown in FIG. 4, menu 200 can include different or alternative options. For example, menu 200 could include an option for clipping a 3-D floor plan to take cross-sections of the floor plan to allow clear visualization of an area of interest. Menu 200 could include an adjustable noise floor to be used in calculating a signal-to-noise ratio (SNR). Menu 200 could include an option to change the model of AP being visualized to permit comparisons between various hardware options. Menu 200 could include an option to adjust the frequency band from 2.4 GHz to 5 GHz to visualize attributes associated with RF propagation at those frequencies. The 2.4 GHz band typically provides a greater distance of coverage, while the 5 GHz band typically provides faster communication speeds. Menu 200 can include antennae options that might permit visualizations using directional antennas or omnidirectional antennas. Menu 200 could provide options for adjusting transmission power of an antenna, or a channel. Menu 200 could also provide various sliders for visualizing animations such as a time scale. Accordingly, the menu can provide many options that can vary depending on the type of visualization being presented.

Figure 5:
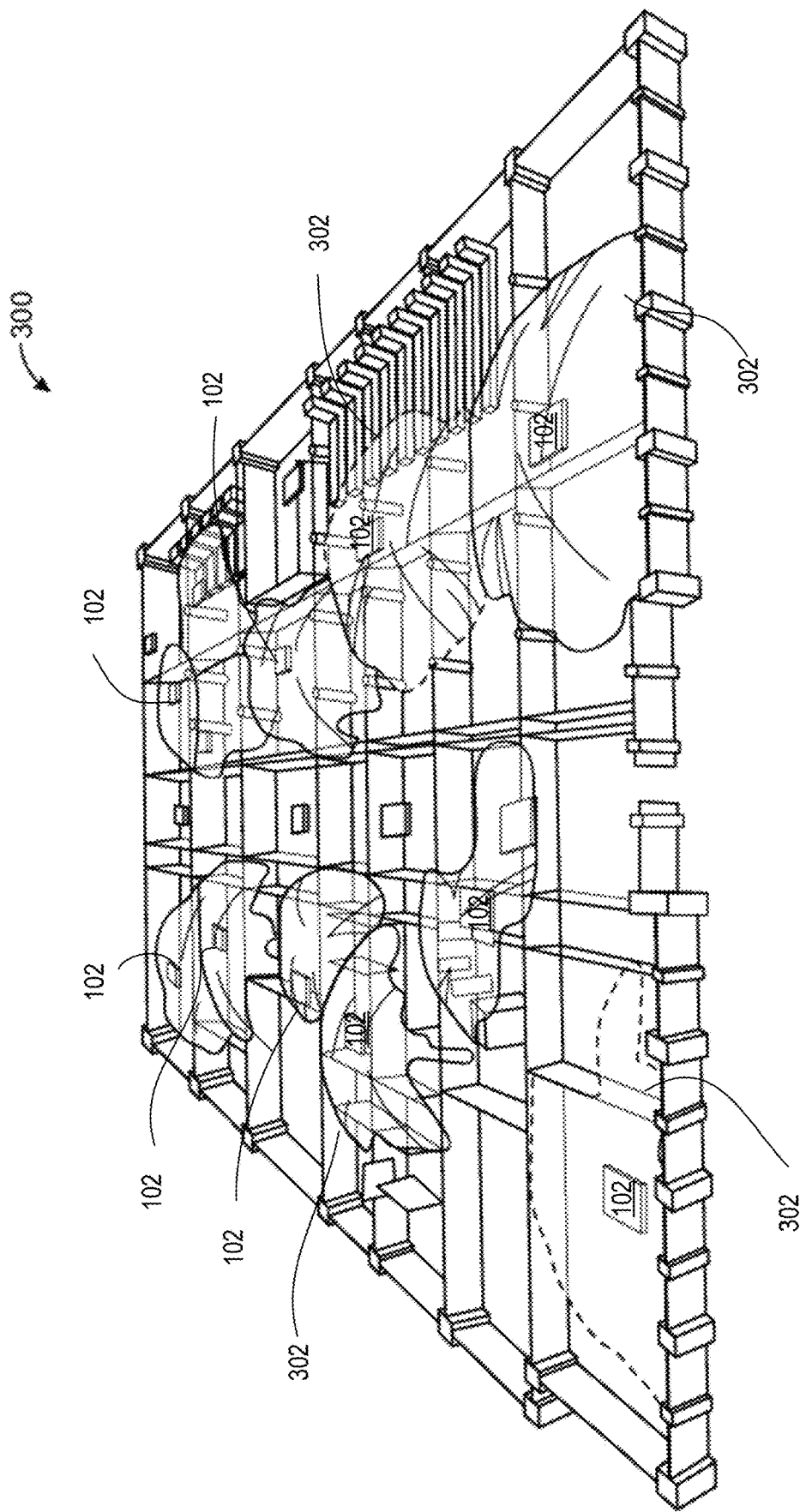
FIG. 5 illustrates an example 3-D visualization of a wireless signal propagation based on a key performance indicator (KPI) according to some aspects of the disclosed technology.

FIG. 5 illustrates an example 3-D visualization 300 of Wi-Fi AP RF signal propagation. In the 3-D visualization 300, the 3-D visualization of a building plan (e.g., floor plan) is overlaid with RF propagation patterns. As shown in FIG. 5, the 3-D visualization 300 illustrates the RF signal propagation patterns as a collection of zones 302 where each zone represents a service area covered by each AP 102 (e.g., AP 102 illustrated in FIG. 1). Each zone is in the shape of a dome to illustrate a signal strength in the service area in 3-D instead of a simple flat layer in 2-D. Furthermore, the color and size of the domes correspond to a degree of signal strength from the AP in the service area. The dome shape acknowledges that the RF propagation from an AP is not uniform at all heights of a floor plan.

Even though the 3-D visualization 300 of Wi-Fi AP RF signal propagation in FIG. 5 uses a color-coded dome model, the 3-D visualization of the RF signal propagation according to the present disclosure can be provided in the form of a point cloud model, a heat map, or a contour map to illustrate the degree of signal strength in the 3-D space.

Figure 6:
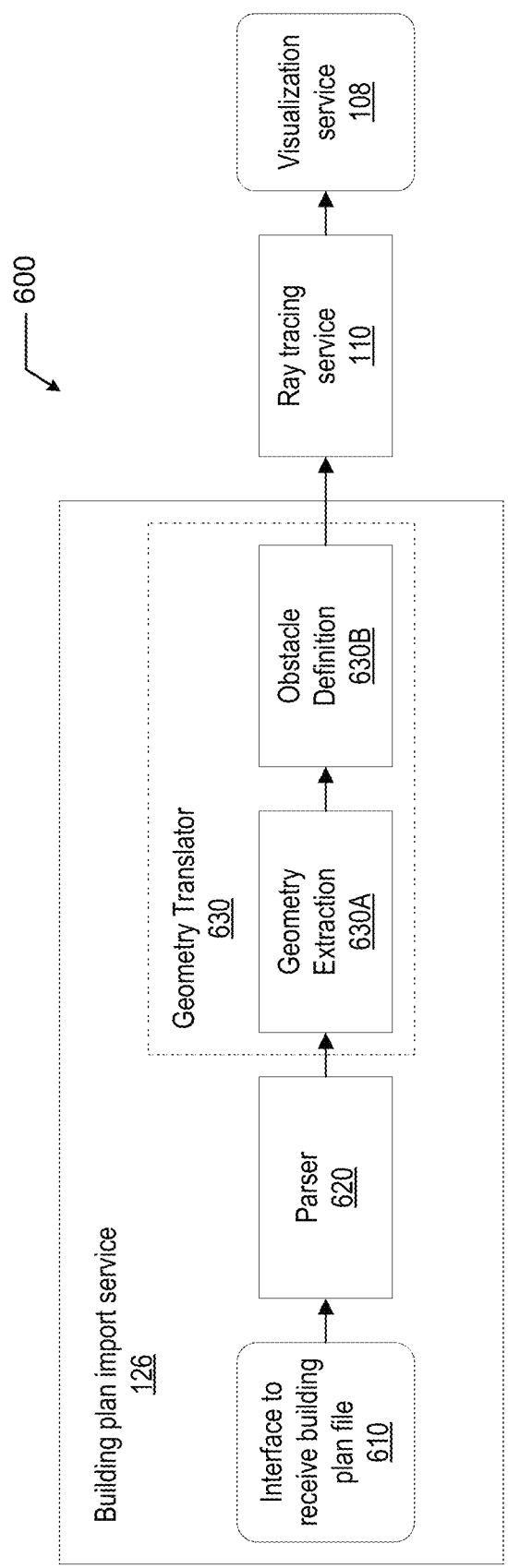
FIG. 6 illustrates an example workflow of an example method for presenting a wireless signal propagation in a 3-D visualization based on a building plan defined with implicit geometry according to some aspects of the disclosed technology.

FIG. 6 illustrates an example system 600 for visualizing a Wi-Fi signal propagation in 3-D based on a building plan defined with implicit geometry. In some examples, the implicit geometry visualization system 600 is part of the 3-D wireless signal propagation visualization system 100 illustrated in FIG. 1. The implicit geometry visualization system 600 comprises interface to receive building plan file 610, parser 620, and geometry translator 630, all of which are part of the building plan import service 126 illustrated in FIG. 1. The implicit geometry visualization system 600 further comprises the ray tracing service 110 and the visualization service 108 illustrated in FIG. 1.

According to some examples, the interface to receive building plan file 610 can import a building plan file, for example, a BIM file where a building plan or a floor plan is defined with implicit geometry. The building plan or the floor plan can provide a basis for the layout of a 3-D space where a graphical representation of a Wi-Fi signal propagation pattern can be overlaid.

According to some examples, the implicit geometry visualization system 600 includes a parser 620 configured to read the building plan file (e.g., BIM file) and extract data associated with objects identified in the 3-D space. For example, the parser 620 can extract data associated with the geometry of a framing/structure of the 3-D space such as walls (internal or external), ceilings, floors, or partitions. The geometry data can include shapes, dimensions, positions, and orientations of the framing/structure. The data can also include types of materials for each of the framing or structural parts, for example, concrete, brick, wood, glass, steel, etc. Furthermore, the parser 620 can extract data associated with the geometry of internal objects placed within the structure such as HVAC ducts, shelving, plumbing fixtures, etc. The geometry data can include shapes, dimensions, positions, and orientations of each of the internal objects. The data can also include types of materials of each of the internal objects, for example, concrete, brick, wood, glass, steel, open space, metal, liquid, or etc.

In some instances, the parser 620 can iterate extracting data over every story defined in the building plan so that the 3-D visualization can display the Wi-Fi signal propagation through multiple floors covering the entire building.

In some examples, the parser 620 can build an object hierarchy based on the geometry of the objects to define a relationship between the objects. The implicit geometry in a local/relative coordinate system specifies a geometry of an object with respect to another object (i.e., a parent). In other words, every object is linked to each other in the local coordinate system. The parser 620 can identify each object defined in the building plan, organize them, and build the object hierarchy based on the relationship (e.g, linkage) between each other. For example, a window is placed with respect to a wall where the wall is placed with respect to a floor in which the floor is placed with respect to a building where the building is placed with respect to a site. The object hierarchy can help translating the local coordinate system into the global coordinate system since each of the geometry definitions needs to be processed in a different way for the geometry extraction as further illustrated below.

According to some examples, the data extracted and organized by the parser 620 can be transmitted to the geometry translator 630 for a geometry extraction 630A and an obstacle definition 630B. An explicit geometry definition where an object's position, orientation, dimensions, and bounds are defined in a global coordinate system is necessary for a ray tracing algorithm to compute the wireless KPIs. Therefore, the geometry translator 630 translates the implicit geometry definition into an explicit geometry definition (i.e., geometry extraction 630A) and identifies objects in the 3-D space (i.e., obstacle definition 630B) to be used for the wireless KPI computations via the ray tracing algorithm.

In some instances, the geometry translator 630 is configured to transform the implicit geometry into an explicit geometry that can be used to render a 3-D visualization. The geometry translator 630 is further configured to translate the relative positioning (e.g., local coordinate system) into a global coordinate system. In a local coordinate system, an object is placed with respect to its parent. For example, as previously described, a window placed with respect to a wall, the wall placed with respect to a floor, the floor placed with respect to a building, the building placed with respect to a site, the site having a global placement, which can be tied to a Global Positioning System (GPS) or Geographical Information System (GIS).

In some examples, the geometry extraction 630A includes translating a width, a length, and an extrusion vector defining a direction and a magnitude of the extrusion into x, y, and z coordinates. In general, an implicit geometry definition uses a planar polygon with a local placement alongside an extrusion vector that defines a way to extrude the planar polygon along a specific direction and for a specific magnitude. The geometry translator 630 identifies vertex positions of the objects by mapping the planar polygon based on the width and length and applying the extrusion vector to translate the coordinate system from a local coordinate system to a global coordinate system. In some instances, the geometry translator 630 computes the global positions of all vertices of the objects and polygonise the corresponding surfaces in the 3-D space to run the ray tracing algorithm.

Detailed illustration of the geometry extraction is provided below with respect to FIGS. 7-11 with examples of a standard rectangular wall, a curved wall, unbounded clipping, and bounded clipping.

Figures 7A, 7B:
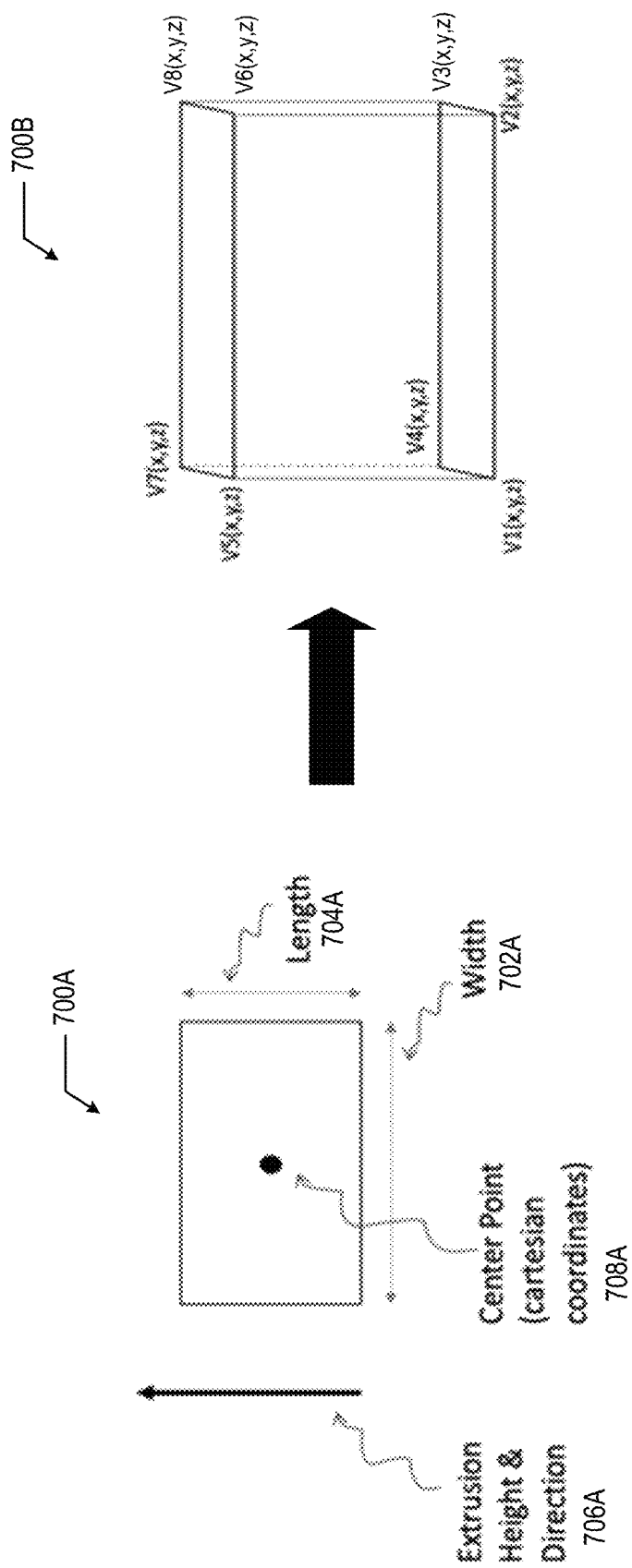
FIGS. 7A and 7B illustrate an example geometry extraction of a standard rectangular wall in accordance with some examples of the present disclosure.

FIGS. 7A and 7B illustrate an example geometry extraction of a standard rectangular wall in accordance with some examples of the present disclosure. As shown in FIG. 7A, a standard rectangle 700A is defined with implicit geometry, i.e., defined as a two-dimensional rectangle with three attributes, a width 702A, a length 704A, and an extrusion vector 706A (magnitude & direction). Also, a center point 708A is provided in cartesian coordinates (i.e., x and y coordinates). The geometry extraction of the standard rectangle 700A includes positioning the base of the standard rectangle 700A in a global coordinate space based on the cartesian coordinates of the center point 708A and applying the extrusion along the height to add an elevation dimension. Then, based on the extrusion, the standard rectangle 700A can be translated into a rectangular cuboid 700B with eight vertices in global coordinates, from V1 (x, y, z) to V8 (x, y, z) as shown in FIG. 7B.

Figure 8A:
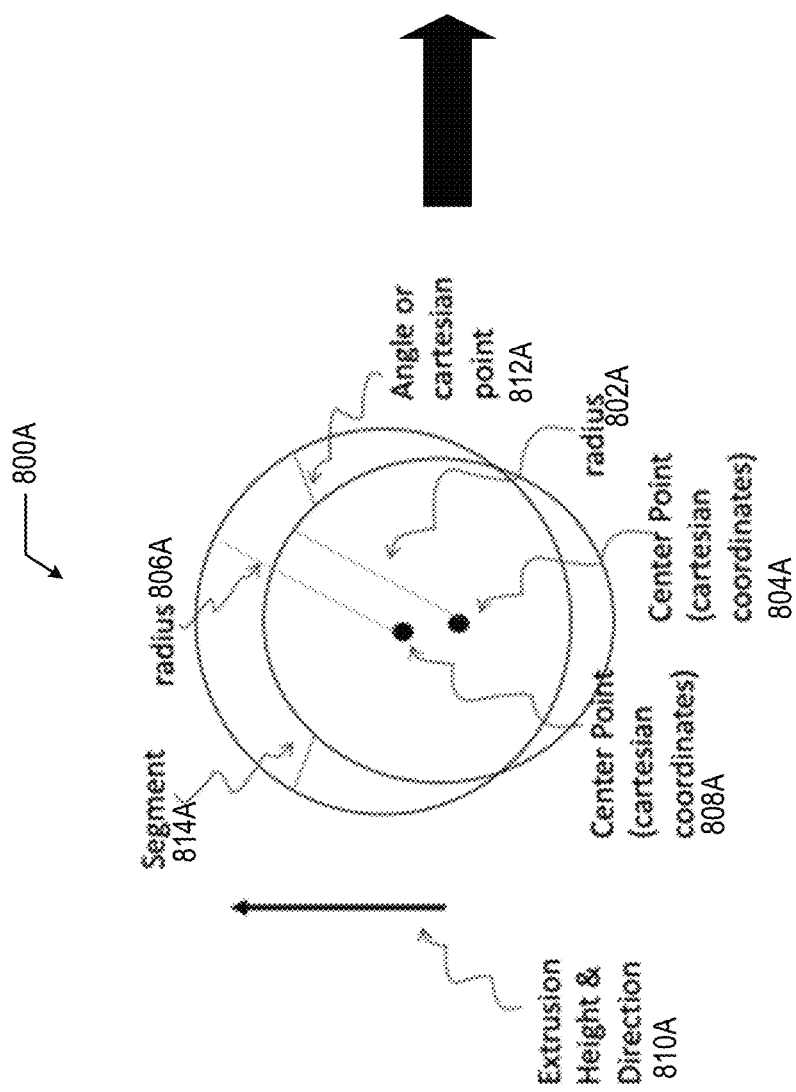
FIGS. 8A and 8B illustrate an example geometry extraction of a curved wall in accordance with some examples of the present disclosure.
Figure 8B:
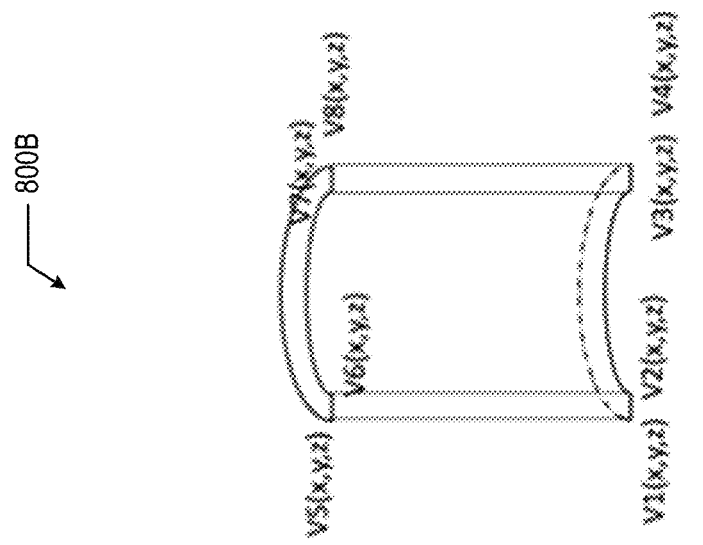

FIGS. 8A and 8B illustrate an example geometry extraction of a curved wall in accordance with some examples of the present disclosure. In the case of the geometry extraction of the curved wall, two 2-D surfaces are defined with implicit geometry, for example, one with a first radius 802A and a first center point 804A in cartesian coordinates and another with a second radius 806A and a second center point 808A in cartesian coordinates. A relationship between these two 2-D surfaces is defined with an extrusion vector 810A (a magnitude and a direction), an angle or cartesian point 812 between the two surfaces, and a segment 814A. Similar to the geometry extraction of the standard rectangular wall 700A as shown in FIGS. 7A and 7B, the geometry extraction of the curved wall includes positioning two surfaces based on the given data points and applying the extrusion and an angle to add an elevation dimension. As a result, a curved wall 800B can be defined with explicit geometry, i.e., with 8 vertices in global coordinates, from V1 (x, y, z) to V8 (x, y, z) as shown in FIG. 8B.

Figures 9A, 9B:
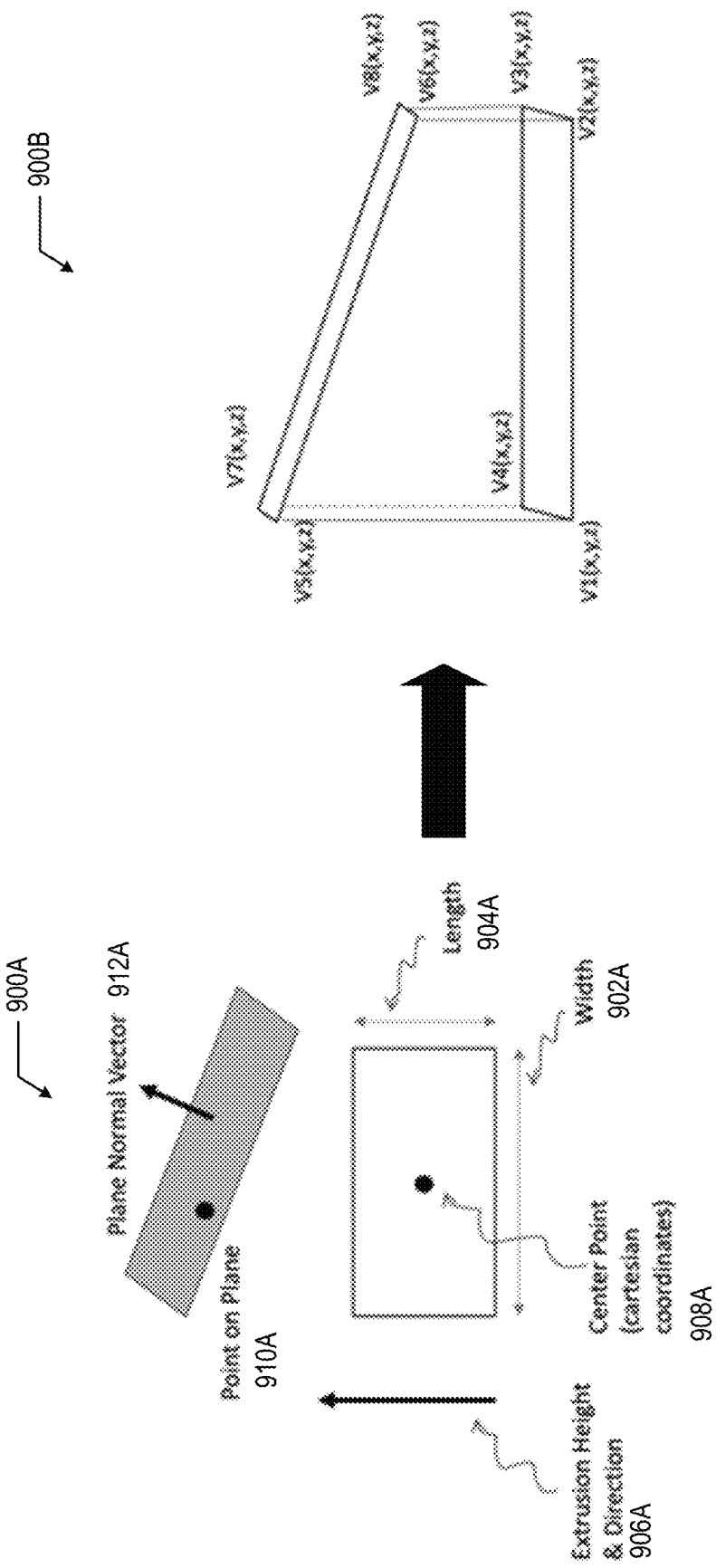
FIGS. 9A and 9B illustrate an example geometry extraction including an unbounded clipping in accordance with some examples of the present disclosure.

FIGS. 9A and 9B illustrate an example geometry extraction including an unbounded clipping in accordance with some examples of the present disclosure. As shown in FIG. 9A, a slanted/angled wall 900A (e.g., a slanted ceiling) is defined with implicit geometry. In addition to a width 902A, a length 904A, an extrusion vector 906A (a magnitude and a direction), and a center point 908A defined in cartesian coordinates (i.e., x and y coordinates), the implicit geometry specification for the slated wall 900A includes a point on plane 910A and a plane normal vector 912A. The geometry extraction for the slanted wall 900A includes a geometry subtraction, i.e., clipping, more specifically, an unbounded clipping.

In the case of unbounded clipping, the geometry specification includes the definition of an infinite clipping plane, which is specified through the point on plane 901A and the plane normal vector 912A. The extruded solid wall, which is translated into explicit geometry based on the width 902A, the length 904A, and the extrusion vector 906A, can be cut off, i.e., clipped away with the clipping plane. As a result of the unbounded clipping, a slanted wall 900B can be defined with explicit geometry, i.e., with 8 vertices in global coordinates, from V1 (x, y, z) to V8 (x, y, z) as shown in FIG. 9B.

FIGS. 10A and 10B illustrate an example geometry extraction including a bounded clipping in accordance with some examples of the present disclosure. An opening or a window 1000A in a wall defined with implicit geometry can be translated into an explicit geometry as shown in FIG. 10B.

In the geometry extraction of bounded clipping, the implicit definition of the opening is translated into an explicit geometry as if it is a solid object. Then, the geometry of the opening can be subtracted (i.e., clipped away) from the geometry of the wall to determine what is solid and what is air (e.g., an open space).

For example, a 2-D polygon (e.g., polyline 1014A) defines the shape of the opening's cut-out. The 2-D polygon 1014A is projected onto a plane, which is specified using a point on plane 1010A and a plane normal vector 1012A. The resulting projection 1016A is then extruded along the z-axis. The opening can be defined based on the resulting extruded solid's intersection with the 3-D wall, which is translated into an explicit geometry based on a width 1002A, a length 1004A, an extrusion vector 1006A (a magnitude and a direction), and a center point 1008A in cartesian coordinates. As a result of the bounded clipping, an opening in a wall 1000B can be defined with explicit geometry, i.e., with 16 vertices in global coordinates, from V1 (x, y, z) to V16 (x, y, z) as shown in FIG. 10B.

FIG. 11A illustrates an example of traditional polygonization and FIG. 11B illustrates an optimized polygonization in accordance with some examples of the present disclosure. The geometry translator 630 computes the global positions of all the vertices and polygonise the corresponding surfaces (e.g., into quadrilaterals or triangles) to run the ray tracing algorithm. For an efficient KPI computation, the polygonization needs to generate a minimal number of polygons that span the object (e.g., wall), taking into account any bounded clipping (i.e., openings such as windows or cut-outs) or unbounded clipping (e.g., slanted edges). The generated polygons are used as the obstructions in the ray tracing algorithm for wireless KPI computations.

In some examples, the geometry translator 630 employs a polygonization technique that produces a minimal number of polygons to represent the objects and polygons with positive attenuation to account for openings as shown in FIG. 11B. While the traditional polygonization 1100A illustrated in FIG. 11A is defined with 4 cuboids/quadrilaterals and negative attenuation, the optimized polygonization 1100B in accordance with the present disclosure is defined with 2 cuboids and positive attenuation. In the optimized polygonization 1100B, a smaller cuboid (i.e., opening) has positive attenuation to account for opening in a wall.

The optimized polygonization process includes starting with mesh at lower bounds and spanning it to max (x, y, z) in a solid mesh. The process further includes assigning a cuboid and repeating for the remaining mesh. The same can be performed for an opening. The process then includes comparing whether the bounding box on mesh, which is combined with polygonization of opening yields a lower number of cuboids compared to polygonization of the mesh itself.

The advantage of the optimized polygonization technique pertains to minimizing the number of cuboids by resorting to model meshes with positive attenuation (i.e., gain). The minimum number of cuboids can significantly reduce the memory utilization on the Graphics Processing Unit (GPU), for example, by a factor of up to 50% in a typical office building environment.

Furthermore, the advantage of having a cuboid as a primitive shape includes reducing texture memory utilization. For example, the cuboid can be efficiently encoded into 3 vectors to optimize texture encoding for a GPU-based ray tracing. Furthermore, the number of polygonal meshes can be minimized compared to triangular meshes, which can, as a result, improve the GPU performance by minimizing loops.

Referring to FIG. 6, according to some examples, the geometry translator 630 performs an obstacle definition 630B. The obstacle definition 630B includes locating and positioning the objects within the space for ray tracing. In other words, once the objects are translated into explicit geometry and placed in a global coordinate system, the objects are identified for the ray tracing algorithm for computing wireless KPIs.

In some examples, the geometry translator 630 translates the extracted geometry into a set of textures so that the obstacle definitions can be fed into the GPU to accelerate the ray tracing algorithms.

In some instances, the geometry translator 630 computes global vertex positions by applying recursive matrix transformations and rotating/translating locally placed objects with respect to their parents until resolving back to the global coordinate system. (positioning of an object is always with respect to its parent)

Furthermore, according to some examples, the geometry translator 630 encodes the geometry and material meta-data in a lookup table to accelerate a wireless KPI computation. For example, the lookup table, typically organized like a database table, provides certain values (e.g., frequently used data) for a faster and easier retrieval so that processing time can be saved. In some instances, the lookup table is in the form of a 2-D texture that can be fed to a GPU to offload and accelerate the computation of the KPIs. Even though a GPU is the most used for full hardware acceleration, other types of processors, for example, CPU can be employed in a similar fashion.

In some examples, prior to the ray tracing, the geometry of access points is identified. In the case where access points are not defined in the building plan or not provided in the building plan file, the access point positioning information can be imported from another source, for example, a wireless planning tool. For example, a user can specify the placement of the access points prior to the ray tracing. The information regarding the placement of the access points needs to be transmitted to the ray tracing service 110 so that ray tracing from each of the access points to all the points in space can be performed to compute the wireless KPI values.

Referring to FIG. 6, according to some examples, the ray tracing service 110 is configured to compute attenuation based on a line-of-sight from a Wi-Fi access point to a particular vertex in the space. The ray tracing service 110 performs a line-of-sight check ("ray tracing") between every position in the building space and the access points to determine which objects (e.g., walls) interrupt the line of sight and determine the attenuation effect of those objects and compute the wireless KPI values. Examples of KPIs include, but are not limited to RSSI measurements, SNR measurements, interference levels.

As illustrated in FIG. 12, the ray tracing service 110 projects a plurality of ray paths from an access point to every pixel in space to determine obstructions. The ray tracing service 110 repeats the ray tracing for every AP for every vertex and space, against all the obstacles that are defined in space. This process is happening in parallel on the GPU at an extremely high speed.

In some examples, the system can take into account the attenuation effect of the objects (e.g., obstacles, walls) based on the parsed data associated with the types of materials. In some instances, the ray tracing service 110 provides default attenuation values for well-known material types and allows the user to customize those values through the user interface (e.g., user interface service 130 illustrated in FIG. 1). As different types of materials can have different attenuation level, information regarding the types of materials can provide more accurate KPI computations.

Details of the ray tracing algorithm are further described below with respect to FIG. 13 with a flowchart for calculating the 3-D RF propagation pattern based on the ray tracing.

According to some examples, the visualization service 108 generates a 3-D visualization of the Wi-Fi signal propagation based on the wireless KPI computations. First, 3-D visualization of the building structure (internal and external) can be constructed based on the explicit geometry of objects. Then, the wireless KPI values within the building structure can be computed by the ray tracing service 110. The visualization service 108 overlays the 3-D visualization of the building structure including the objects defined in the building plan with the Wi-Fi signal propagation pattern obtained based on the wireless KPI values. In some instances, different colors, shapes, or sizes of zones representing the Wi-Fi signal propagation from each access point in heat maps can correspond to the varying wireless KPI values.

In some examples, based on the data related to the types of materials, the 3-D visualization reflects the textures of the objects to match the types of materials and to provide a more realistic visualization.

In some instances, the 3-D visualizations can be represented in a heat map as a point cloud visualization or an isosurface visualization. A user can select a desired view option through a user interface (e.g., user interface service 130 illustrated in 1).

In some examples, the present disclosure can be used in ingesting a BIM file and automatically extracting the relevant semantic information stored in the BIM file to drive the KPI computation logic.

Figure 13:
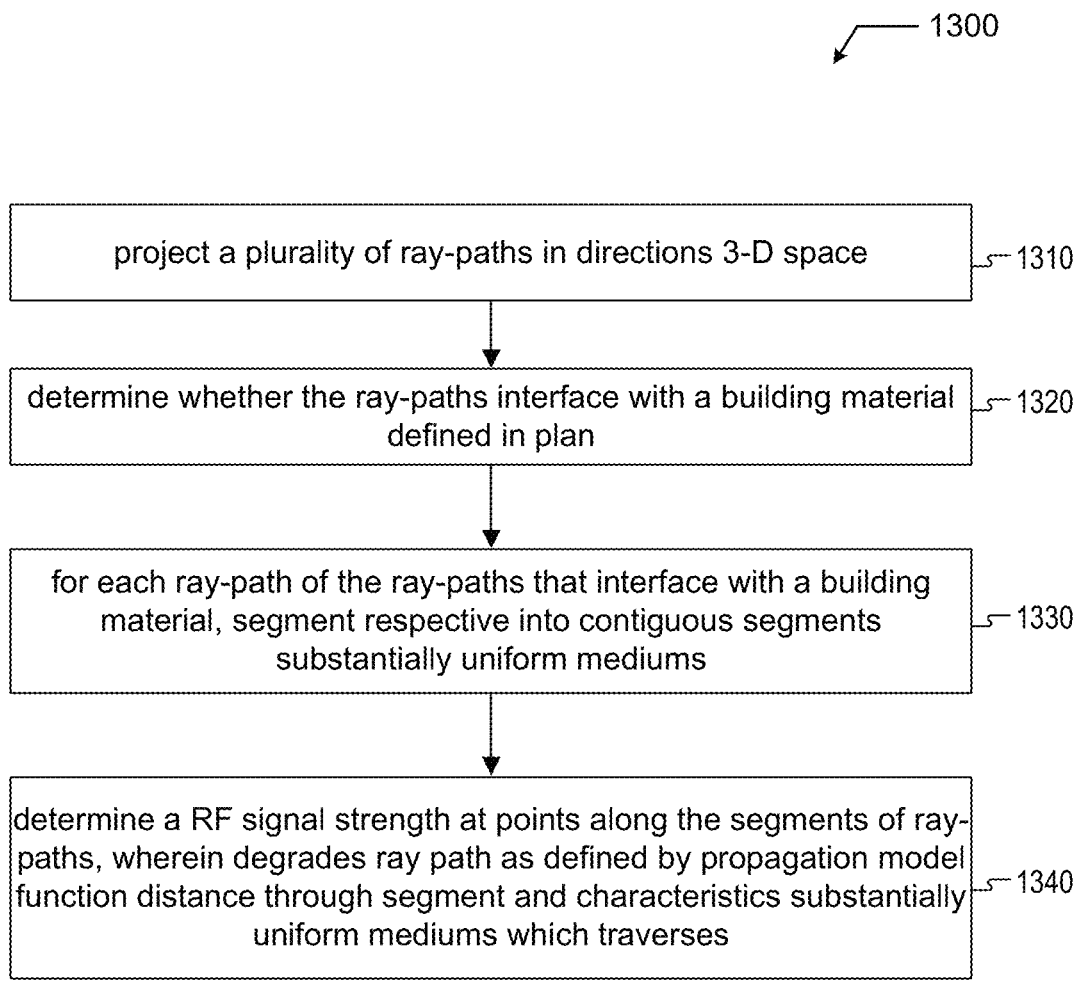
FIG. 13 is a flowchart of an example method for determining a radio frequency (RF) signal strength at points distributed in a 3-D space according to some examples of the present disclosure.

An example method 1300 for calculating the 3-D RF propagation pattern is illustrated in FIG. 13. The method 1300 includes projecting a plurality of ray-paths in a plurality of directions in 3-D space at block 1310. For example, the ray tracing service 110 illustrated in FIGS. 1 and 6 may project a plurality of ray-paths in a plurality of directions in 3-D space. In some embodiments, the ray-paths originate from the Wi-Fi AP and emanate in a variety of X, Y, and Z planes.

The method 1300 includes determining whether the ray-paths interface with a building material defined in a building plan at block 1320. For example, the ray tracing service 110 illustrated in FIGS. 1 and 6 may determine whether the ray-paths interface with a building material defined in a building plan.

The method 1300 includes segmenting each ray-path of the ray-paths that interface with a building material the respective ray-path into contiguous segments of substantially uniform mediums at block 1330. For example, the ray tracing service 110 illustrated in FIGS. 1 and 6 may segment the respective ray-path into contiguous segments of substantially uniform mediums.

The ray tracing service 110 can provide the segmented ray paths to an AP model service 106. The combination of the collection of ray paths for any AP and model information from AP model service 106 can be provided to visualization service 108.

The method 1300 includes determining a RF signal strength at points along the segments of the ray-paths at block 1340. For example, the visualization service 108 illustrated in FIG. 1 may determine a RF signal strength at points along the segments of the ray-paths. The visualization service 108 can use the information about the collection of ray paths for any AP and a RF propagation model particular to the type of AP and the parameters for the specification AP to determine the RF signal strength at points along the segments of the ray-paths. In some embodiments, the signal degrades along the ray path as defined by the RF propagation model as a function of distance through the segment and characteristics of RF propagation through the substantially uniform mediums through which the segment traverses.

Figure 14:
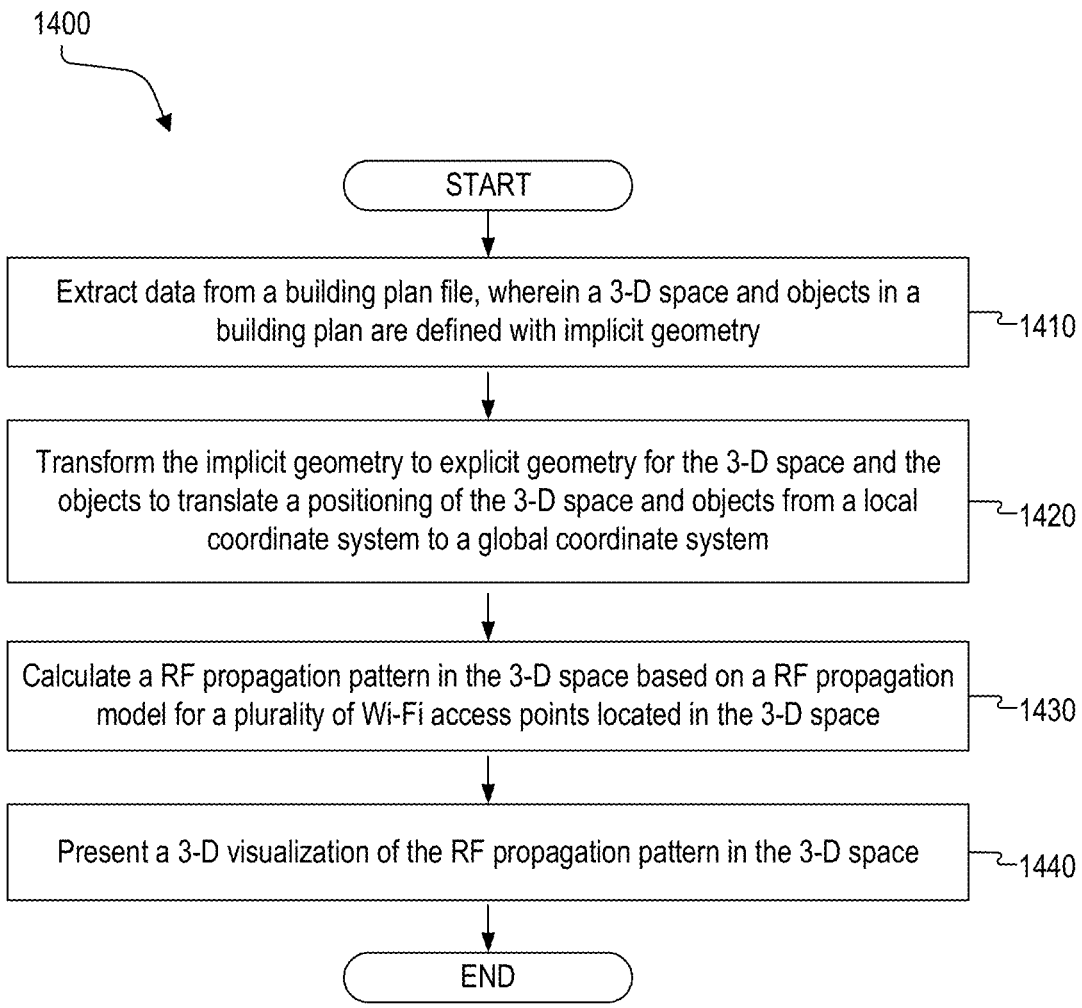
FIG. 14 is a flowchart of a method for visualizing a Wi-Fi signal propagation in 3-D based on a building plan defined with implicit geometry according to some examples of the present disclosure.

FIG. 14 illustrates an example method 1400 for visualizing a Wi-Fi signal propagation in 3-D based on a building plan defined with implicit geometry. Although the example method 1400 depicts a particular sequence of operations, the sequence may be altered without departing from the scope of the present disclosure. For example, some of the operations depicted may be performed in parallel or in a different sequence that does not materially affect the function of the method 1400. In other examples, different components of an example device or system that implements the method 1400 may perform functions at substantially the same time or in a specific sequence.

According to some examples, the method 1400 includes extracting data from a building plan file at step 1410. For example, the parser 620 illustrated in FIG. 6 may extract data from a building plan file. In some examples, a 3-D space and objects in a building plan are defined with implicit geometry. In some examples, the data from the building plan includes a type of materials of the objects. In some examples, the building plan file is in a BIM format.

In another example of the extracting data from the building plan file at step 1410, the method comprises defining a relationship between the objects in the object hierarchy. For example, the parser 620 illustrated in FIG. 1 may define a relationship between the objects in the object hierarchy.

According to some examples, the method includes transforming the implicit geometry to explicit geometry for the 3-D space and the objects to translate a positioning of the 3-D space and objects from a local coordinate system to a global coordinate system at step 1420. For example, the geometry translator 630 illustrated in FIG. 6 may transform the implicit geometry to explicit geometry for the 3-D space and the objects to translate a positioning of the 3-D space and objects from a local coordinate system to a global coordinate system.

In another example of the transforming the implicit geometry to explicit geometry at step 1420, the method comprises translating a width, a length, and an extrusion vector defining a direction and a magnitude of the extrusion used in the implicit geometry into x, y, and z coordinates. For example, the geometry translator 630 illustrated in FIG. 6 may translate a width, a length, and an extrusion vector defining a direction and a magnitude of the extrusion used in the implicit geometry into x, y, and z coordinates.

In a first example of the transforming the implicit geometry to explicit geometry at step 1420, the method comprises computing the global positions of all vertices and polygonising corresponding surfaces of the 3-D space and the objects. For example, the geometry translator 630 illustrated in FIG. 6 may compute the global positions of all vertices and polygonise corresponding surfaces of the 3-D space and the objects.

In a second example of the transforming the implicit geometry to explicit geometry at step 1420, the method comprises encoding data associated with the geometry and a type of materials of the objects in a lookup table to accelerate the calculating the RF propagation pattern in the 3-D space. For example, the geometry translator 630 illustrated in FIG. 6 may encode data associated with the geometry and a type of materials of the objects in a lookup table to accelerate the calculating the RF propagation pattern in the 3-D space. In some examples, the lookup table is a 2-D texture to be transmitted to a GPU.

According to some examples, the method includes calculating a RF propagation pattern in the 3-D space based on a RF propagation model for a plurality of Wi-Fi access points located in the 3-D space at step 1430. For example, the raytracing service 110 illustrated in FIGS. 1 and 6 may calculate a RF propagation pattern in the 3-D space based on a RF propagation model for a plurality of Wi-Fi access points located in the 3-D space.

According to some examples, the method includes presenting a 3-D visualization of the RF propagation pattern in the 3-D space at step 1440. For example, the visualization service 108 illustrated in FIG. 6 may present a 3-D visualization of the RF propagation pattern in the 3-D space. In some examples, the visualization of the RF propagation pattern illustrates textures of the objects based on the type of materials of the objects. In some examples, the 3-D visualization of the RF propagation pattern includes an attenuation level of the RF propagation pattern based on the type of materials of the objects. In some examples, the visualization of the RF propagation pattern illustrates at least one attribute of the RF propagation pattern such as signal-to-noise ratio (SNR), signal strength, interference, received signal strength indicators (RSSIs), and channel.

Figure 15:
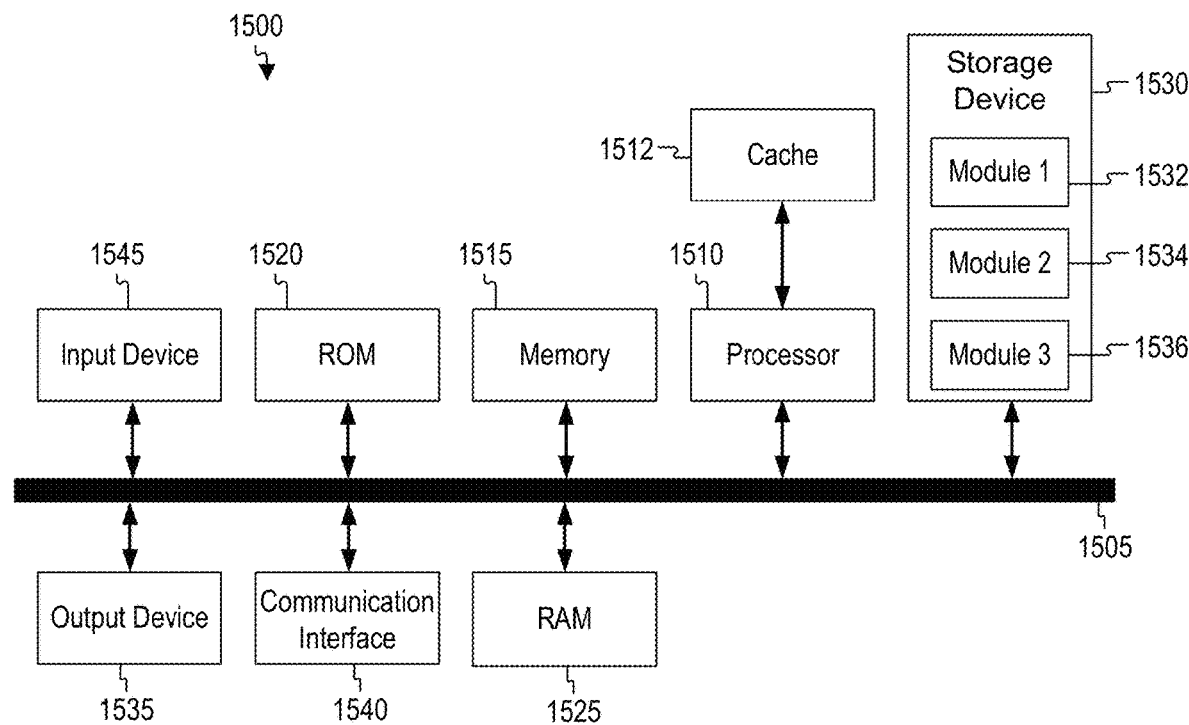
FIG. 15 shows an example of computing system 1400, which can be for example any computing device that can implement components of the system illustrated in FIG. 1.

FIG. 15 shows an example of computing system 1500, which can be for example any computing device making up 3-D signal propagation visualization system 100, or any component thereof in which the components of the system are in communication with each other using connection 1505. Connection 1505 can be a physical connection via a bus, or a direct connection into processor 1510, such as in a chipset architecture. Connection 1505 can also be a virtual connection, networked connection, or logical connection.

In some embodiments computing system 1500 is a distributed system in which the functions described in this disclosure can be distributed within a datacenter, multiple datacenters, a peer network, etc. In some embodiments, one or more of the described system components represents many such components each performing some or all of the function for which the component is described. In some embodiments, the components can be physical or virtual devices.

Example system 1500 includes at least one processing unit (CPU or processor) 1510 and connection 1505 that couples various system components including system memory 1515, such as read only memory (ROM) 1520 and random access memory (RAM) 1525 to processor 1510. Computing system 1500 can include a cache of high-speed memory 1512 connected directly with, in close proximity to, or integrated as part of processor 1510.

Processor 1510 can include any general purpose processor and a hardware service or software service, such as services 1532, 1534, and 1536 stored in storage device 1530, configured to control processor 1510 as well as a special-purpose processor where software instructions are incorporated into the actual processor design. Processor 1510 may essentially be a completely self-contained computing system, containing multiple cores or processors, a bus, memory controller, cache, etc. A multi-core processor may be symmetric or asymmetric.

To enable user interaction, computing system 1500 includes an input device 1545, which can represent any number of input mechanisms, such as a microphone for speech, a touch-sensitive screen for gesture or graphical input, keyboard, mouse, motion input, speech, etc. Computing system 1500 can also include output device 1535, which can be one or more of a number of output mechanisms known to those of skill in the art. In some instances, multimodal systems can enable a user to provide multiple types of input/output to communicate with computing system 1500. Computing system 1500 can include communications interface 1540, which can generally govern and manage the user input and system output. There is no restriction on operating on any particular hardware arrangement and therefore the basic features here may easily be substituted for improved hardware or firmware arrangements as they are developed.

Storage device 1530 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read only memory (ROM), and/or some combination of these devices.

The storage device 1530 can include software services, servers, services, etc., that when the code that defines such software is executed by the processor 1510, it causes the system to perform a function. In some embodiments, a hardware service that performs a particular function can include the software component stored in a computer-readable medium in connection with the necessary hardware components, such as processor 1510, connection 1505, output device 1535, etc., to carry out the function.

For clarity of explanation, in some instances the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program, or a collection of programs that carry out a specific function. In some embodiments, a service can be considered a server. The memory can be a non-transitory computer-readable medium.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, solid state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Aspect 1. A method for visualizing a RF propagation pattern based on a building plan defined with implicit geometry, the method comprising: extracting data from a building plan file, wherein a 3-D space and objects in a building plan are defined with implicit geometry; transforming the implicit geometry to explicit geometry for the 3-D space and the objects to translate a positioning of the 3-D space and objects from a local coordinate system to a global coordinate system; calculating a RF propagation pattern in the 3-D space based on a RF propagation model for a plurality of Wi-Fi access points located in the 3-D space; and presenting a 3-D visualization of the RF propagation pattern in the 3-D space.

Aspect 2. The method of Aspect 1, wherein the calculating the RF propagation pattern in the 3-D space includes: projecting a plurality of ray paths in a plurality of directions from each of the plurality of Wi-Fi access points, where the ray paths originate from the Wi-Fi access points and emanate in a variety of X, Y, and Z planes; determining whether the plurality of ray paths interface with the objects; for each ray-path of the plurality of ray paths that interface with the objects, segmenting the respective ray path into continuous segments of substantially uniform mediums; and determining a RF signal strength at points along the segments of the ray paths, wherein the signal degrades along the ray path as defined by the RF propagation model as a function of distance through the segment and characteristics of the RF propagation through the substantially uniform mediums through which the segment traverses.

Aspect 3. The method of any of Aspects 1 to 2, wherein the transforming the implicit geometry to explicit geometry includes: translating a width, a length, and an extrusion vector defining a direction and a magnitude of the extrusion used in the implicit geometry into x, y, and z coordinates.

Aspect 4. The method of any of Aspects 1 to 3, wherein the transforming the implicit geometry to explicit geometry includes: computing the global positions of all vertices and polygonising corresponding surfaces of the 3-D space and the objects.

Aspect 5. The method of any of Aspects 1 to 4, wherein the data from the building plan includes a type of materials of the objects, and wherein the 3-D visualization of the RF propagation pattern includes an attenuation level of the RF propagation pattern based on the type of materials of the objects.

Aspect 6. The method of any of Aspects 1 to 5, wherein the visualization of the RF propagation pattern illustrates textures of the objects based on the type of materials of the objects.

Aspect 7. The method of any of Aspects 1 to 6, further comprising: encoding data associated with the geometry and a type of materials of the objects in a lookup table to accelerate the calculating the RF propagation pattern in the 3-D space.

Aspect 8. The method of any of Aspects 1 to 7, wherein the lookup table is a 2-D texture to be transmitted to a Graphics Processing Unit (GPU).

Aspect 9. The method of any of Aspects 1 to 8, wherein the extracting data from the building plan includes: building an object hierarchy; and defining a relationship between the objects in the object hierarchy.

Aspect 10. The method of any of Aspects 1 to 9, wherein the visualization of the RF propagation pattern illustrates at least one attribute of the RF propagation pattern such as signal-to-noise ratio (SNR), signal strength, interference, received signal strength indicators (RSSIs), and channel.

Aspect 11. The method of any of Aspects 1 to 10, wherein the building plan file is in a Building Information Modeling (BIM) format.

Aspect 12. A system comprising: a storage configured to store instructions; a processor configured to execute the instructions and cause the processor to: extract data from a building plan file, wherein a 3-D space and objects in a building plan are defined with implicit geometry; transform the implicit geometry to explicit geometry for the 3-D space and the objects to translate a positioning of the 3-D space and objects from a local coordinate system to a global coordinate system; calculate a RF propagation pattern in the 3-D space based on a RF propagation model for a plurality of Wi-Fi access points located in the 3-D space; and present a 3-D visualization of the RF propagation pattern in the 3-D space.

Aspect 13. The system of Aspect 12, wherein the instructions of calculating the RF propagation pattern cause the processor to: project a plurality of ray paths in a plurality of directions from each of the plurality of Wi-Fi access points, where the ray paths originate from the Wi-Fi access points and emanate in a variety of X, Y, and Z planes; determine whether the plurality of ray paths interface with the objects; for each ray-path of the plurality of ray paths that interface with the objects, segment the respective ray path into continuous segments of substantially uniform mediums; and determine a RF signal strength at points along the segments of the ray paths, wherein the signal degrades along the ray path as defined by the RF propagation model as a function of distance through the segment and characteristics of the RF propagation through the substantially uniform mediums through which the segment traverses.

Aspect 14. A non-transitory computer readable medium comprising instructions, the instructions, when executed by a computing system, cause the computing system to: extract data from a building plan file, wherein a 3-D space and objects in a building plan are defined with implicit geometry; transform the implicit geometry to explicit geometry for the 3-D space and the objects to translate a positioning of the 3-D space and objects from a local coordinate system to a global coordinate system; calculate a RF propagation pattern in the 3-D space based on a RF propagation model for a plurality of Wi-Fi access points located in the 3-D space; and present a 3-D visualization of the RF propagation pattern in the 3-D space.

Aspect 15. A method for visualizing a RF propagation pattern based on a building plan defined with implicit geometry, the method comprising: calculating a RF propagation based on a RF propagation model for a Wi-Fi access point, the calculating including: projecting a plurality of ray paths in a plurality of directions from each of the plurality of Wi-Fi access points, where the ray paths originate from the Wi-Fi access point and emanate in a variety of X, Y, and Z planes; determining whether the plurality of ray paths interface with one or more objects, wherein the one or more objects are defined with implicit geometry; for each ray-path of the plurality of ray paths that interface with the one or more objects, segmenting the respective ray path into continuous segments of substantially uniform mediums; and determining a RF signal strength at points along the segments of the ray paths, wherein the signal degrades along the ray path as defined by the RF propagation model as a function of distance through the segment and characteristics of the RF propagation through the substantially uniform mediums through which the segment traverses.

Aspect 16. A system comprising: a storage configured to store instructions; a processor configured to execute the instructions and cause the processor to: calculate a RF propagation based on a RF propagation model for a Wi-Fi access point, the instructions of calculating the RF propagation cause the processor to: project a plurality of ray paths in a plurality of directions from each of the plurality of Wi-Fi access points, where the ray paths originate from the Wi-Fi access point and emanate in a variety of X, Y, and Z planes; determine whether the plurality of ray paths interface with one or more objects, wherein the one or more objects are defined with implicit geometry; for each ray-path of the plurality of ray paths that interface with the one or more objects, segment the respective ray path into continuous segments of substantially uniform mediums; and determine a RF signal strength at points along the segments of the ray paths, wherein the signal degrades along the ray path as defined by the RF propagation model as a function of distance through the segment and characteristics of the RF propagation through the substantially uniform mediums through which the segment traverses.

Aspect 17. A non-transitory computer readable medium comprising instructions, the instructions, when executed by a computing system, cause the computing system to: calculate a RF propagation based on a RF propagation model for a Wi-Fi access point, the instructions of calculating the RF propagation cause the computing system to: project a plurality of ray paths in a plurality of directions from each of the plurality of Wi-Fi access points, where the ray paths originate from the Wi-Fi access point and emanate in a variety of X, Y, and Z planes; determine whether the plurality of ray paths interface with one or more objects, wherein the one or more objects are defined with implicit geometry; for each ray-path of the plurality of ray paths that interface with the one or more objects, segment the respective ray path into continuous segments of substantially uniform mediums; and determine a RF signal strength at points along the segments of the ray paths, wherein the signal degrades along the ray path as defined by the RF propagation model as a function of distance through the segment and characteristics of the RF propagation through the substantially uniform mediums through which the segment traverses.

Aspect 18. A method for visualizing a RF propagation pattern based on a building plan defined with implicit geometry, the method comprising: identifying one or more objects in a building plan defined with implicit geometry; locating a Wi-Fi access point in the building plan; and calculating a RF propagation based on a RF propagation model for the Wi-Fi access point, the calculating including: projecting a plurality of ray paths in a plurality of directions from each of the plurality of Wi-Fi access points, where the ray paths originate from the Wi-Fi access point and emanate in a variety of X, Y, and Z planes; determining whether the plurality of ray paths interface with the one or more objects; for each ray-path of the plurality of ray paths that interface with the one or more objects, segmenting the respective ray path into continuous segments of substantially uniform mediums; and determining a RF signal strength at points along the segments of the ray paths, wherein the signal degrades along the ray path as defined by the RF propagation model as a function of distance through the segment and characteristics of the RF propagation through the substantially uniform mediums through which the segment traverses.

Aspect 19. A system comprising: a storage configured to store instructions; a processor configured to execute the instructions and cause the processor to: identify one or more objects in a building plan defined with implicit geometry; locate a Wi-Fi access point in the building plan; and calculate a RF propagation based on a RF propagation model for the Wi-Fi access point, the instructions of calculating the RF propagation cause the processor to: where the ray paths originate from the Wi-Fi access point and emanate in a variety of X, Y, and Z planes; determine whether the plurality of ray paths interface with the one or more objects; for each ray-path of the plurality of ray paths that interface with the one or more objects, segment the respective ray path into continuous segments of substantially uniform mediums; and determine a RF signal strength at points along the segments of the ray paths, wherein the signal degrades along the ray path as defined by the RF propagation model as a function of distance through the segment and characteristics of the RF propagation through the substantially uniform mediums through which the segment traverses.

What is claimed is:

1. A method for visualizing a Radio Frequency (RF) propagation pattern based on a building plan defined with implicit geometry, the method comprising:
   extracting data from a building plan file, wherein a three-dimensional space and objects in the building plan are defined with the implicit geometry;
   transforming the implicit geometry to explicit geometry for the three-dimensional space and the objects to translate a positioning of the three-dimensional space and the objects from a local coordinate system to a global coordinate system;
   projecting a plurality of ray paths in a plurality of directions from each of a plurality of Wi-Fi access points;
   identifying objects that intersect with one or more of the plurality of ray paths;
   calculating a RF propagation pattern in the three-dimensional space based on a RF propagation model for a plurality of Wi-Fi access points located in the three-dimensional space, the plurality of ray paths, and the objects that intersect the one or more of the plurality of ray paths; and
   presenting a three-dimensional visualization of the RF propagation pattern in the three-dimensional space.

2. The method of claim 1, wherein the calculating the RF propagation pattern in the three-dimensional space includes:
   for each respective ray-path of the plurality of ray paths that intersect with the objects, segmenting the respective ray path into continuous segments of substantially uniform mediums; and
   determining a RF signal strength at points along the segments of the ray paths, wherein the RF signal strength degrades along the ray path as defined by the RF propagation model as a function of distance through the segments of the ray paths and characteristics of the RF propagation through the substantially uniform mediums through which the segments of the ray paths traverse, wherein
   the ray paths originate from the Wi-Fi access points and emanate in a variety of X, Y, and Z planes.

3. The method of claim 1, wherein the transforming the implicit geometry to explicit geometry includes:
   translating a width, a length, and an extrusion vector defining a direction and a magnitude of extrusion used in the implicit geometry into x, y, and z coordinates.

4. The method of claim 1, wherein the transforming the implicit geometry to explicit geometry includes:
   computing the global positions of all vertices and polygonising corresponding surfaces of the three-dimensional space and the objects.

5. The method of claim 1, wherein the data from the building plan includes a type of materials of the objects, and wherein the three-dimensional visualization of the RF propagation pattern includes an attenuation level of the RF propagation pattern based on the type of materials of the objects.

6. The method of claim 5, wherein the three-dimensional visualization of the RF propagation pattern illustrates textures of the objects based on the type of materials of the objects.

7. The method of claim 1, further comprising:
   encoding the data associated with the geometry and a type of materials of the objects in a lookup table to accelerate the calculating the RF propagation pattern in the three-dimensional space.

8. The method of claim 7, wherein the lookup table is a two-dimensional or three-dimensional texture to be transmitted to a Graphics Processing Unit (GPU).

9. The method of claim 1, wherein the extracting data from the building plan includes:
   building an object hierarchy; and
   defining a relationship between the objects in the object hierarchy.

10. The method of claim 1, wherein the three-dimensional visualization of the RF propagation pattern illustrates at least one attribute of the RF propagation pattern such as signal-to-noise ratio (SNR), signal strength, interference, received signal strength indicators (RSSIs), and channel.

11. The method of claim 1, wherein the building plan file is in a Building Information Modeling (BIM) format.

12. A system comprising:
a storage configured to store instructions;
a processor configured to execute the instructions and cause the processor to:
extract data from a building plan file, wherein a three-dimensional space and objects in the building plan are defined with implicit geometry;
transform the implicit geometry to explicit geometry for the three-dimensional space and the objects to translate a positioning of the three-dimensional space and the objects from a local coordinate system to a global coordinate system;
project a plurality of ray paths in a plurality of directions from each of a plurality of Wi-Fi access points;
identify objects that intersect with one or more of the plurality of ray paths;
calculate a RF propagation pattern in the three-dimensional space based on a Radio Frequency (RF) propagation model for a plurality of Wi-Fi access points located in the three-dimensional space; and
present a three-dimensional visualization of the RF propagation pattern in the three-dimensional space.

13. The system of claim 12, wherein the instructions of calculating the RF propagation pattern cause the processor to:
for each respective ray-path of the plurality of ray paths that interface with the objects, segment the respective ray path into continuous segments of substantially uniform mediums; and
determine a RF signal strength at points along the segments of the ray paths, wherein the RF signal strength degrades along the ray path as defined by the RF propagation model as a function of distance through the segments of the ray paths and characteristics of the RF propagation through the substantially uniform mediums through which the segments of the ray paths traverse wherein
the ray paths originate from the Wi-Fi access points and emanate in a variety of X, Y, and Z planes.

14. The system of claim 12, wherein the instructions of transforming the implicit geometry to explicit geometry cause the processor to:
translate a width, a length, and an extrusion vector defining a direction and a magnitude of extrusion used in the implicit geometry into x, y, and z coordinates.

15. The system of claim 12, wherein the instructions of transforming the implicit geometry to explicit geometry cause the processor to:
compute the global positions of all vertices and polygonising corresponding surfaces of the three-dimensional space and the objects.

16. The system of claim 12, wherein the data from the building plan includes a type of materials of the objects, and wherein the three-dimensional visualization of the RF propagation pattern includes an attenuation level of the RF propagation pattern based on the type of materials of the objects.

17. A non-transitory computer readable medium comprising instructions, the instructions, when executed by a computing system, cause the computing system to:
extract data from a building plan file, wherein a three-dimensional space and objects in the building plan are defined with implicit geometry;
transform the implicit geometry to explicit geometry for the three-dimensional space and the objects to translate a positioning of the three-dimensional space and the objects from a local coordinate system to a global coordinate system;
project a plurality of ray paths in a plurality of directions from each of a plurality of Wi-Fi access points;
identify objects that intersect with one or more of the plurality of ray paths;
calculate a Radio Frequency (RF) propagation pattern in the three-dimensional space based on a RF propagation model for a plurality of Wi-Fi access points located in the three-dimensional space; and
present a three-dimensional visualization of the RF propagation pattern in the three-dimensional space.

18. The non-transitory computer readable medium of claim 17, wherein the instructions are further effective to cause the computing system to:
for each respective ray-path of the plurality of ray paths that interface with the objects, segment the respective ray path into continuous segments of substantially uniform mediums; and
determine a RF signal strength at points along the segments of the ray paths, wherein the RF signal strength degrades along the ray path as defined by the RF propagation model as a function of distance through the segments of the ray paths and characteristics of the RF propagation through the substantially uniform mediums through which the segments of the ray paths traverse wherein
the ray paths originate from the Wi-Fi access points and emanate in a variety of X, Y, and Z planes.

19. The non-transitory computer readable medium of claim 17, wherein the instructions to transform the implicit geometry to explicit geometry further cause the computing system to:
translate a width, a length, and an extrusion vector defining a direction and a magnitude of extrusion used in the implicit geometry into x, y, and z coordinates.

20. The non-transitory computer readable medium of claim 17, wherein the instructions to transform the implicit geometry to explicit geometry further cause the computing system to:
compute the global positions of all vertices and polygonising corresponding surfaces of the three-dimensional space and the objects.

* * * * *